United States Patent
Lie et al.

(10) Patent No.: US 11,322,588 B2
(45) Date of Patent: May 3, 2022

(54) CONTACT SOURCE/DRAIN RESISTANCE

(71) Applicant: International Business Machines Corporation, Armonk, NY (US)

(72) Inventors: Fee Li Lie, Albany, NY (US); Choonghyun Lee, Rensselaer, NY (US); Kangguo Cheng, Schenectady, NY (US); Hemanth Jagannathan, Niskayuna, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 16/601,535

(22) Filed: Oct. 14, 2019

(65) Prior Publication Data

US 2021/0111246 A1  Apr. 15, 2021

(51) Int. Cl.
*H01L 29/08* (2006.01)
*H01L 27/092* (2006.01)
(Continued)

(52) U.S. Cl.
CPC .... *H01L 29/0847* (2013.01); *H01L 21/02532* (2013.01); *H01L 21/02554* (2013.01);
(Continued)

(58) Field of Classification Search
CPC ............ H01L 29/0847; H01L 27/0924; H01L 29/0673; H01L 29/66795; H01L 29/7851;
(Continued)

(56) References Cited

U.S. PATENT DOCUMENTS 6,924,518 B2  8/2005  Iinuma et al.
8,623,728 B2  1/2014  Chang
(Continued)

OTHER PUBLICATIONS

C. H. Lee, H. Kim*, P. Jamison, R. G. Southwick III. S. Mochizuki, K. Watanabe, R. Bao, R. Galatage*, S. Guillaumet**, T. Ando, R. Pandey*, A. Konar*, B. Lherron**, J. Fronheiser*, S. Siddiqui*, H. Jagannathan, V. Paruchuri "Selective GeOx-Scavenging from Interfacial Layer on Si1-xGex Channel for High Mobility Si/Si1-xGex CMOS Application", IBM Research, *GLOBALFOUNDRIES Inc., **STMicroelectronics 257 Fuller Road, Suite 3100, Albany, NY 12203.
(Continued)

*Primary Examiner* — Mouloucoulaye Inoussa
(74) *Attorney, Agent, or Firm* — L. Jeffrey Kelly; Steven Meyers; Lou Percello, Attorney, PLLC

(57) ABSTRACT

A nonplanar MOSFET device such as a FinFET or a sacked nanosheets/nanowires FET has a substrate, one or more nonplanar channels disposed on the substrate, and a gate stack enclosing the nonplanar channels. A first source/drain (S/D) region is disposed on the substrate on a source side of the nonplanar channel and second S/D region is disposed on the substrate on a drain side of the nonplanar channel. The first and second S/D regions made of silicon-germanium (SiGe). In some embodiments, both S/D regions are p-type doped. Contact trenches provide a metallic electrical connection to the first and the second source/drain (S/D) regions. The S/D regions have two parts, a first part with a first concentration of germanium (Ge) and a second part with a second, higher Ge concentration that is a surface layer having convex shape and aligned with one of the contact trenches.

20 Claims, 10 Drawing Sheets

(51) Int. Cl.
  *H01L 29/06* (2006.01)
  *H01L 29/66* (2006.01)
  *H01L 29/78* (2006.01)
  *H01L 21/02* (2006.01)
  *H01L 21/8238* (2006.01)

(52) U.S. Cl.
  CPC ............... *H01L 21/823807* (2013.01); *H01L 21/823814* (2013.01); *H01L 21/823821* (2013.01); *H01L 21/823871* (2013.01); *H01L 27/0924* (2013.01); *H01L 29/0673* (2013.01); *H01L 29/66795* (2013.01); *H01L 29/7851* (2013.01)

(58) Field of Classification Search
  CPC ....... H01L 21/02554; H01L 21/823814; H01L 21/823821; H01L 21/823871; H01L 21/02532; H01L 21/823807; H01L 29/41791; H01L 29/785; H01L 27/0886; H01L 29/41758; H01L 29/161; H01L 29/36; H01L 29/45; H01L 27/1104; H01L 29/78696; H01L 29/42392; H01L 29/1033; H01L 21/30604; H01L 29/66803; H01L 21/02236; H01L 21/02255; H01L 21/2254; H01L 21/845; H01L 27/1203; H01L 29/1045; H01L 27/1211; H01L 27/0922; H01L 29/16; H01L 29/20; H01L 29/41725; H01L 23/535; H01L 23/53266; H01L 21/76864; H01L 21/76884; H01L 21/76895; H01L 21/76805; G06F 30/367

USPC .. 257/191, 192, 288, 369, E21.102, E27.06; 438/478, 233, 285

See application file for complete search history.

(56) References Cited

U.S. PATENT DOCUMENTS

| | | | |
|---|---|---|---|
| 9,634,142 | B1 | 4/2017 | Schepis et al. |
| 9,659,939 | B1 * | 5/2017 | Cao .................... H01L 27/10829 |
| 9,741,822 | B1 | 8/2017 | Jagannathan et al. |
| 9,812,571 | B2 | 11/2017 | Doris et al. |
| 9,837,533 | B2 | 12/2017 | Kuang et al. |
| 10,147,820 | B1 | 12/2018 | Ando et al. |
| 10,347,762 | B1 * | 7/2019 | Liu ....................... H01L 29/7848 |
| 2018/0026100 | A1 | 1/2018 | Jagannathan et al. |
| 2018/0076040 | A1 | 3/2018 | Ando et al. |
| 2018/0240875 | A1 * | 8/2018 | Gluschenkov ........ H01L 29/165 |
| 2019/0019881 | A1 * | 1/2019 | Kuang ................ H01L 29/7848 |

OTHER PUBLICATIONS

C. Niu, M. Raymond, V. Kamineni, J. Fronheiser, S. Siddiqui, H. Niimi, J. M. Dechene, A. Labonte; GLOBALFOUNDRIES Inc., 257 Fuller Road, Albany, NY 12203 and P. Adusumilli, A.V. Carr, J. Shearer, J. Demarest, L. Jiang, J. Li, R.W. Hengstebeck; IBM, 257 Fuller Road, Albany, NY 12203 **IBM, 2070 Route 52 Hopewell Junction, NY 12533; "Interface Preservation During Ge-Rich Source/Drain Contact Formation".

* cited by examiner

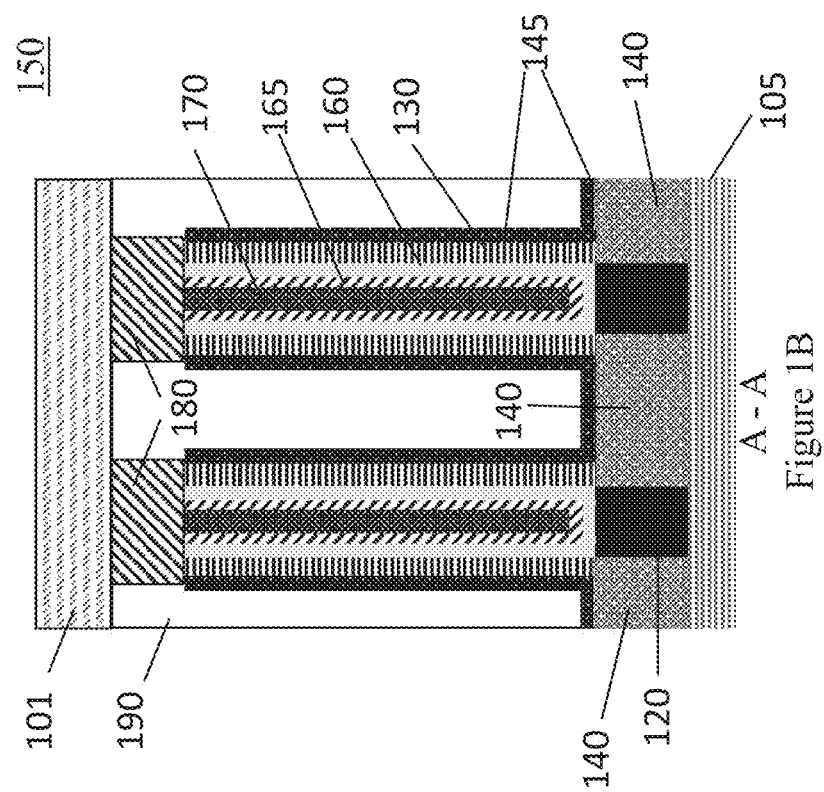
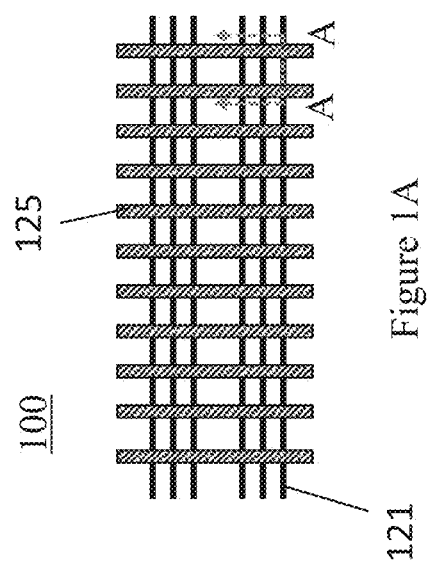
Figure 1A
Figure 1B

CONTACT SOURCE/DRAIN RESISTANCE

BACKGROUND

The present invention relates to Metal Oxide Semiconductor Field Effect Transistors (MOSFETs). More specifically, the invention relates to reducing the contact resistance of the Source/Drain (S/D) regions of MOSFETs.

Contact resistance causes resistance to current flow and is related to surface conditions at metallic connections with internal semiconducting structures of devices like MOSFETs. Adverse effects of contact resistance increase as the size of nonplanar MOSFETs, e.g. FinFETs or sacked nanosheets/nanowires, scale down to nanometer (nm) dimensions. Particularly, contact resistance at metallic connections to the source/drain (S/D) regions of nonplanar MOSFETs can limit device performance.

To improve device performance, there is a need to reduce the contact resistance, e.g. reduce contact resistivity and/or enlarge the contact area, of metallic connections to the S/D regions of nonplanar MOSFET devices.

SUMMARY

One embodiment of the present invention is a nonplanar MOSFET device such as a FinFET or a sacked nanosheets/nanowires FET and structure that have a substrate, one or more nonplanar channels disposed on the substrate, and a gate stack enclosing the nonplanar channels. A first source/drain (S/D) region is disposed on the substrate on a source side of the nonplanar channel and a second S/D region is disposed on the substrate on a drain side of the nonplanar channel. The first and second S/D regions are made of silicon-germanium (SiGe). In some embodiments, both S/D regions are p-type doped. Contact trenches provide a metallic electrical connection to the first and the second source/drain (S/D) regions. The S/D regions have two parts, a first part with a first concentration of germanium (Ge) and a second part with a second, higher concentration of Ge that is a surface layer having convex shape and aligned with one of the contact trenches. The surface layer can be implanted with gallium or aluminum to decrease contact resistivity and additional metallic layers can be disposed on the surface layer. Methods of making the structure are disclosed.

BRIEF DESCRIPTION OF THE DRAWINGS

Various embodiments of the present invention will be described below in more detail, with reference to the accompanying drawings, now briefly described. The Figures show various apparatus, structures, devices, and related method steps of the present invention.

FIG. 1A is a top down view of a substrate with a plurality of nonplanar FET structures embodying the present invention.

FIG. 1B is a cross section view of a preliminary structure of two of the nonplanar FET formed by a method of making the present invention.

DETAILED DESCRIPTION

Figure 2:
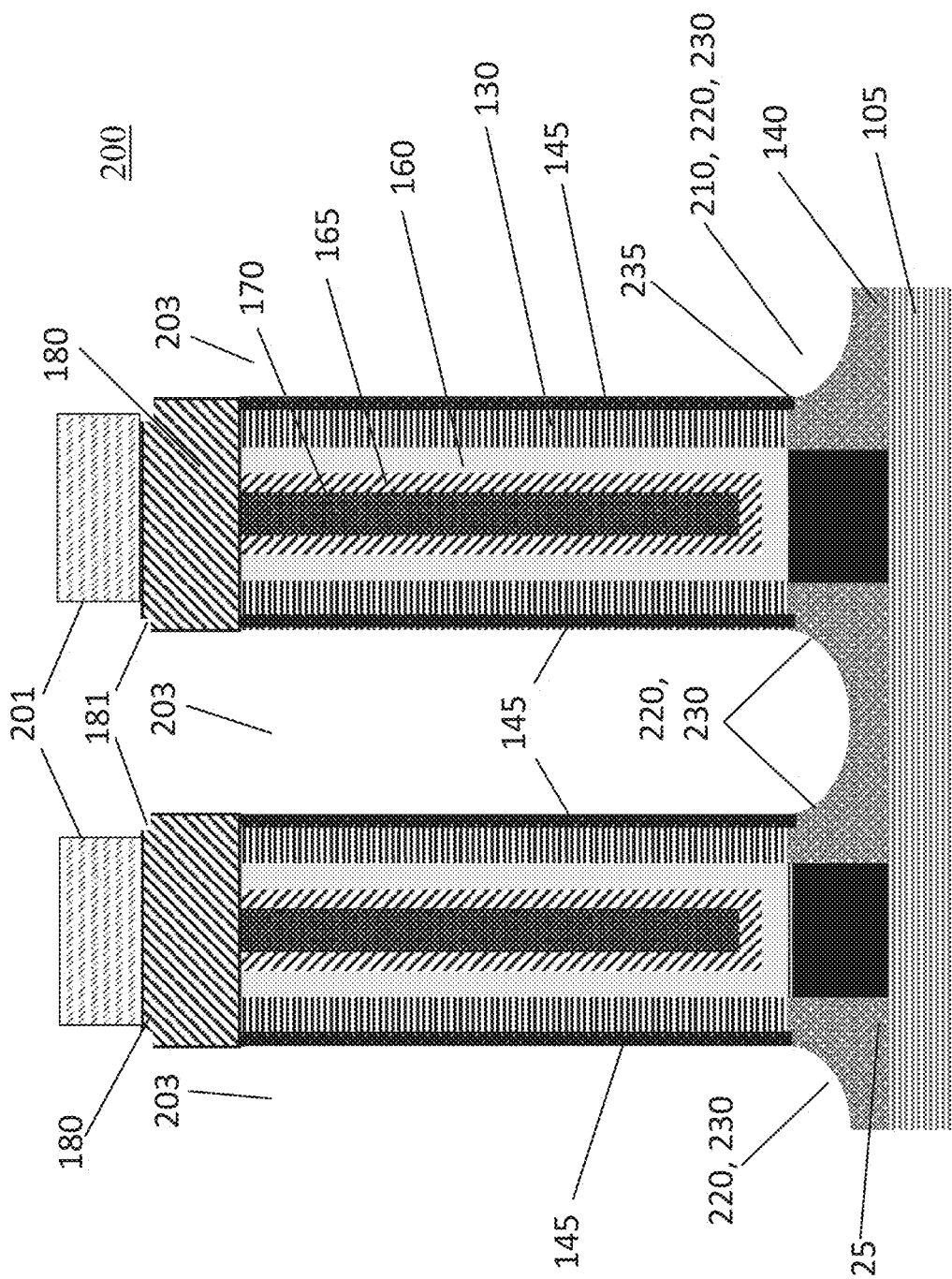
FIG. 2 is a cross section of the nonplanar FET structures after forming contact trenches punching through a horizontal contact etch stop layer (CESL) layer and removing some S/D region surface material between the fins.

It is to be understood that embodiments of the present invention are not limited to the illustrative methods, apparatus, structures, systems and devices disclosed herein but also are more broadly applicable to other alternative and broader methods, apparatus, structures, systems and devices that become evident to those skilled in the art given this disclosure.

In addition, it is to be understood that the various layers, structures, devices, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

Further, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral", "lateral side", "side", and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin", or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Metal Oxide Semiconductor Field Effect Transistors (MOSFETs) generally include source and drain regions interconnected by a channel region, and at least one gate that regulates current flow through the channel region. Metal contacts to the source and drain regions are often made by forming a metallic compound such as metal silicide or germano-silicide over the source drain material. Metallic conductors are then used to wire transistor terminals (source, drain, and gate) into useful circuits, for instance, CMOS circuits. Accordingly, the electrical current flows from a metallic conductor into source metallic compound, across the interface between the source metallic compound and the source material, through the source material, into the channel, through the channel, and through the same regions on the drain side of the transistor. In a well-designed transistor, the channel resistance dominates other parasitic resistance components. Traditionally, geometrical downscaling of the channel length resulted in a lower channel resistance and improved transistor performance. However, the transistor parasitic resistance has become a limiting factor in achieving desired transistor performance at reduced geometry.

The contact resistance between the metallic contacts and the source drain material is an important consideration, especially with scaled transistors with reduced channel resistance. Namely, as the contact area becomes increasingly smaller, the contact resistance becomes increasing larger and a greater concern for transistor performance. A physical property of material interfaces that measures contact resistance of a given contact area is known as a specific contact resistivity or contact resistivity. Typical contact resistivities are below $10^{-10}$ $\Omega cm^2$ for metal-metal interfaces, below $3\times10^{-10}$ $\Omega cm^2$ for unipolar semiconductor-semiconductor interfaces, and below $10^{-8}$ $\Omega cm^2$ for metal-semiconductor interfaces. Accordingly, reducing metal-semiconductor contact resistivity became a focused effort for mitigating adverse impact of overall contact resistance. Both source/drain metallic compound and adjacent source/drain semiconducting material can be engineered to obtain a contact resistivity in a lower $10^{-9}$ $\Omega cm^2$ range. However, such improved contact structures must be compatible with the transistor fabrication flow (i.e. must be thermally stable during subsequent fabrication steps) and shall not substantially degrade other transistor performance elements including reduced series resistance of source/drain, reduced wire resistance of contact conductors, electrically-thin gate dielectric, and gate-to-source/drain parasitic capacitance.

Non-planar geometry of both the transistor channel and the contact area plays an important role in enabling scaled-down transistors with improved performance. Nonplanar transistor channels including but not limiting to fin-shaped channels, stacked nanowire channels and stacked nanosheet channels have a larger effective channel width per given transistor footprint. Larger effective channel width results in a reduced transistor channel resistance but, at the same time, increases the adverse impact of the contact resistance onto transistor performance. Therefore, reducing contact resistance in nonplanar transistors is paramount to achieving improved transistor performance. Other than reducing specific contact resistivity of contact interfaces, the contact resistance can be decreased by enlarging contact area without changing contact footprint. Various conventional approaches known as the wrap-around contacts were directed toward this goal by wrapping metallic sourced/drain compound over 3-dimensional (3D) surface of semiconducting source/drain structure. However, these approaches have limitations since they require a contact trench larger than the entire source/drain structure to expose source/drain sidewall surfaces or, alternatively, the metallic source/drain compound needs to be formed early in the fabrication flow limiting choices for metal-semiconductor interface engineering leading to a high interfacial resistivity (e.g. in the excess of $2\times10^{-9}$ $\Omega cm^2$). Larger contact trenches lead to an increased gate-to-source/drain parasitic capacitance and degraded transistor switching frequency.

In one aspect of the present application, a nonplanar PFET with improved contact structure is provided. In one embodiment, the nonplanar PFET includes a substrate, a nonplanar channel disposed on the substrate, a gate stack enclosing the nonplanar channel, a first source/drain (S/D) region disposed on the substrate on a source side of the nonplanar channel and a second S/D region disposed on the substrate on a drain side of the nonplanar channel, the first and second S/D regions made of silicon-germanium (SiGe) with a first concentration of germanium (Ge), a second (higher) Ge concentration surface layer aligned with a contact trench, the second (higher) Ge concentration surface layer having a convex shape, the second Ge concentration being higher than the first concentration of Ge, and metallic conductors within the contact trench and in contact with the second (higher) Ge concentration surface layer. In one embodiment, the first Ge concentration is from 45% to 75% and the second Ge concentration is from 65% to 95%.

In some embodiments, the higher Ge concentration surface layer is doped with a high-solubility p-type dopant such boron (B), gallium (Ga), and/or aluminum (Al). In some embodiments, the higher Ge concentration surface layer is doped with Ga and B with combined concentration of dopants exceeding the maximum solid solubility limit of both Ga and B in the host SiGe or higher than about 3 atomic percent (at. %) or, equivalently, higher than $1.5 \times 10^{21}$ atoms/$cm^3$. The contact resistivity between the metallic conductor and the first or second S/D regions is less than $10^{-9}$ $\Omega cm^2$. When contact resistance is normalized to nonplanar transistor channel effective width, the resultant PFET contact resistance $R_c$ is reduced to be less than half of PFET S/D series parasitic resistance $R_{epi}$ or, in some embodiments, to less than about 25 $\Omega \mu m$ per a single source or drain PFET contact with 15 nm-wide trench. The nonplanar PFET device can be a FinFET device or a stacked nanosheet/nanowire device.

In another aspect of the present application, a method of forming a nonplanar FET with improved contact structure is provided. In one embodiment, the method includes forming a convex surface of the first and second S/D regions through the contact trench, depositing a layer of germanium oxide (for example, GeO2, which also will be used herein to describe the composition of the layer, without loss of generality) into the contact trench and onto the exposed convex surface of the first and second S/D regions, applying heat at an anneal temperature to convert the layer of GeO2 into a layer of silicon dioxide (SiO2) resulting in an increase in germanium (Ge) concentration in the exposed convex surface of the S/D regions, removing layers of SiO2 and unreacted GeO2, and forming an improved electrical contact between Ge-enriched convex S/D surface and metallic conductors deposited into contact trenches.

As used herein, the term "convex" or "convex surface" refers to a mathematical function describing such surface rather than the surface itself and means a surface that is "concave pointing upward" or a surface bulging downward. The convex surface is a surface 230 shown in FIG. 2 that would "metaphorically hold water". Most of the points on the convex surface lie below the top of the channel 120, as shown in FIGS. 2 through 4 and 6 through 9.

In some embodiments, the conversion anneal temperature is selected to be compatible with the temperature-sensitive gate stack and is below 500° C. and, preferably, below 450° C.

In some embodiments, the step of forming the improved contact with the Ge-enriched convex S/D surface includes implanting Ga ions through contact trench into Ge-enriched convex S/D surface, re-crystallizing implanted amorphous surface region with a gate-stack-compatible anneal, depositing metallic materials into the contact trench, and alloying metallic materials with the doped Ge-enriched convex S/D surface. The Ga implantation dose is preferably from $1 \times 10^{15}$ ions/$cm^2$ to $5 \times 10^{15}$ ions/$cm^2$ and the Ga implantation energy is preferably from 1 keV to 10 keV. The re-crystallization of amorphous implanted surface region can be achieved with a short-duration laser anneal.

The step of depositing metallic materials includes sequential deposition of a thin elemental metal such as titanium (Ti) followed by a metallic barrier layer such as titanium nitride (TiN) followed by another elemental metal conductor such as cobalt (Co), tungsten (W), or ruthenium (Ru). The alloying step includes annealing the contact structure using a gate-stack-compatible anneal to form an interfacial metal germano-silicide such as titanium germano-silicide (TiGeSi) in between the Ge-enriched convex S/D surface and the adjacent metal. The gate-stack-compatible alloying or silicidation anneal can be a short-duration laser anneal.

Refer now to the Figures.

FIG. 1A is a top down, plan view of a plurality of nonplanar FET (e.g. FinFETs) structures 100 with fins 121 and gates 125, on a substrate 105. Alternative nonplanar FETs include gate-all-around wires or nanosheets, where the structure 121 represents a stack of wires and nanosheets. Gates 125 surround and encompass the fins including their tops (as shown in FIG. 1B) and fin sides (in the direction perpendicular to that shown in FIG. 1B), e.g. a first and second fin side. In the case of nanosheets or wires, the gates 125 wrap around all nanosheets or wires and encompass the entire stack 121 from the stack top (as shown in FIG. 1B) and stack sides (in the direction perpendicular to that shown in FIG. 1B). View A-A is a view looking perpendicular to the axis of the gates 125 and cut through the axis of a fin 121.

FIG. 1B is a cross section view A-A of a preliminary structure 150 of two of the nonplanar FETs (e.g. FinFETs or stacked nanosheet/nanowire FETs) formed by one method of making the present invention. The preliminary structure 150 is made using a standard replacement metal gate (RMG) process.

The RMG process begins with a substrate 105 that can be crystalline, semi-crystalline, microcrystalline, or amorphous. The substrate 105 can be made from (e.g., except for contaminants) a single element (e.g., silicon or germanium), primarily a single element (e.g., with doping), or a compound, for example, gallium arsenide (GaAs), silicon carbide (SiC), or silicon-germanium (SiGe). In some embodiments, the substrate 105 includes one or more semiconductor materials including, but not limited to, silicon (Si), SiGe, SiC, Si:C (carbon doped silicon), silicon germanium carbide (SiGeC), germanium (Ge), carbon doped silicon germanium (SiGe:C), Si alloys, Ge alloys, III-V materials (e.g., GaAs, aluminum gallium arsenide (AlGaAs), indium arsenide (InAs), indium phosphide (InP), aluminum arsenide (AlAs), etc.), II-V materials (e.g., cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), zinc cadmium selenide (ZnCdSe), etc., or any combination thereof) or other like semiconductors. In addition, multiple layers of the semiconductor materials can be used as the semiconductor material of the substrate 105. In some embodiments, the substrate 105 includes both semiconductor materials and dielectric materials. In some silicon on insulator (SOI) implementations, a buried oxide layer, BOX, (e.g., SiO2) is buried in the substrate 105.

The fins or stacked nanosheets/nanowires 121 are formed by forming a silicon (Si) and/or silicon-germanium (SiGe) layers, between 50 to 150 nanometers (nm) in total thickness with individual layers for stacked nanosheets from 6 nm to 20 nm, upon the substrate 105. The Si/SiGe layer is patterned and etched to form the Si/SiGe fins or stacked nanosheets/nanowires 121. In some embodiment, the fins or the stacked nanosheets/nanowires 121 are directly formed in the substrate when the starting substrate is a semiconductor material.

The NFET and PFET device regions are created by known alternating opening and blocking processes. The dummy gate stack (not shown) is deposited, patterned, etched, and encapsulated from sides by the dielectric spacer 130. The spacer 130 can be formed by conformally depositing a dielectric material (e.g., by an atomic layer deposition (ALD)) followed by a directional etch process (e.g., reactive ion etch (RIE)) to remove the dielectric material from the horizontal surfaces. The spacer 130 has a uniform thickness between 3 to 20 nm. The spacer 130 can be made of dielectric oxides (e.g. silicon oxide), dielectric nitrides (e.g., SiN, SiBCN), dielectric oxynitrides (e.g., SiOCN, SiCO), or any combination thereof. This structure defines the position of future permanent or RMG gate stack 160/165/170 as well as the position of channel region 120 and adjacent source/drain (S/D) regions 140. Substrate material in S/D regions 140 can be first removed by an etching process (e.g., a directional etch process, or a directional etch process followed by an isotropic etch process) using dummy gate and spacer 130 as a blocking mask for the channel. The respective source/drain (S/D) 140 regions are then epitaxially grown on the substrate 105 and surround the channels 120. The PFET S/D regions 140 are doped with boron (B), gallium (Ga), indium (In) or thallium (Ti) and the NFET S/D regions are doped with arsenic (As), antimony (Sb), or phosphorous (P).

The PFET S/D 140 regions have a concentration of Ge in the range between 20 to 75 atomic percent and can be graded with a lower concentration of Ge in the interior portion of the region 140 and a higher concentration of Ge toward the surface of the region 140. For example, when the concentration of Ge atoms is 20%, the percentage of Si and other atoms is 80% and when the percentage concentration of Ge is 75% the percentage of Si and other atoms is 25%. In some embodiments, the atomic percentage of Ge is around 55% plus or minus 5%. Stated another way, when the S/D regions 140 have a 20% concentration of Ge, 20% of the atoms in the material are Ge and 80% of the atoms in the material are not Ge, e.g. silicon.

The concentration of Ge and its profile, the type of dopant and its profile, and the amount of dopant are optimized to provide the lowest series resistance within regions 140 and to be compatible with the channel region 120. A sequence of high-temperature anneals is often required to extend source/drain regions 140 underneath spacer 130 and to activate dopants within regions 140 to a high degree, thus, achieving the lowest series resistance within regions 140. The sequence of high-temperature anneals includes a diffusion anneal conducted at a temperature higher than 900° C. for several seconds and an activation anneal conducted at a temperature higher than 1100° C. for durations shorter than tens of milliseconds.

The purpose of the diffusion anneal is to diffuse source/drain dopants underneath spacer 130 to extend regions 140 underneath spacer 130 such that they overlap with the respective edges of gate stack 160/165/170 as shown in FIG. 1B. Compatibility of source/drain material to channel region 120 is defined with respect to this diffusion anneal such that regions 140 form a sharp edge (e.g. an abrupt junction) with the channel region 120 near respective edges of the gate stack 160/165/170. Excessive penetration of source/drain constituents (e.g. dopants and Ge) into the channel region 120 interferes with the normal transistor operation causing adverse short-channel effects (SCE's) manifested as a degraded Drain-Induced Barrier Lowering (DIBL) and degraded Subthreshold Slope. This typically limits concentrations of doping and Ge in the vicinity of spacer 130 edges and leads to doping and Ge concentration grading within regions 140.

The purpose of the activation anneal is to electrically activate dopants within regions 140 with minimum impact onto dopant diffusion. Dopant activation is referred to the physical process of placing dopants into substitutional lattice sites of S/D crystalline material. Once a dopant occupies a substitutional lattice site, it contributes to free electrical carriers (electrons and holes) thereby reducing electrical resistivity. Dopant atoms that are clustered together or occupy interstitial sites often do not contribute to free electrical carriers and may cause additional free carrier scattering, thus, increasing material electrical resistivity. A certain level of dopants can be uniformly dissolved in the host solid material without forming clusters or precipitates. This level of dopant is known as the solid solubility of dopant in a host material. A portion of uniformly dissolved dopant occupies substitutional lattice sites contributing to free electrical carriers. Solid solubility of common dopants in SiGe crystalline material is higher at an elevated temperature reaching maximum at from about 1100° C. to about 1300° C. depending on Ge content and dopant type. Therefore, in some embodiments, the activation anneal brings regions 140 to above 1100° C. and preferably from 1150° C. to 1300° C. for a short period of time necessary to move a dopant atom to a nearby substitutional lattice site. This process takes about several microseconds and the activation anneals are typically longer than several microseconds. When the activation anneal is decoupled from the diffusion anneals, its duration is chosen to be short enough not to induce substantial diffusion of dopants and is typically shorter than tens of milliseconds. Importantly, a high peak temperature of the activation anneal may limit the maximum Ge content in regions 140 due to inadvertent melting. For instance, SiGe with 60% Ge has melting points of 1060° C. (solidus) and 1220° C. (liquidus). Raising anneal temperature above solidus melt point may cause Ge precipitation and an increase in electrical resistivity. Raising anneal temperature above liquidus melt point causes liquification of S/D material. Volume changes associated with the liquification and ability of the liquid to migrate may cause defects and is generally avoided for the durations longer than few microseconds. Accordingly, there is a limitation on activation anneal peak temperature that is dependent on Ge concentration in SiGe and the anneal duration. For shorter activation anneals the limit moves toward liquidus melting point and for longer activation anneals it moves toward solidus melting point. It should be appreciated that portions of regions 140, especially under spacer 130 and in a proximity of the channel 120, can have a lower Ge at. % and would require an activation anneal with a higher peak temperature in order to reduce their electrical resistivity. A similar requirement on activation anneal peak temperature may be driven by the presence of transistors with silicon-based source/drain regions such as the case of NFET's. As the result, achieving a low series resistance of source/drain regions 140 requires a high peak anneal temperature that, in turn, sets a limit for the maximum Ge concentration in S/D structures.

Diffusion anneals can be conducted in a conventional rapid thermal anneal (RTA) equipment and/or in Flash Lamp annealers. Activation anneals can be conducted in short-duration annealing equipment such as millisecond-scale (mSec) Flash Lamp annealers, mSec Laser Annealing (LA) tools, and nanosecond-scale (nSec) Laser Annealing tools. Diffusion and activation anneals can be conducted in the same equipment such as in a Flash Lamp annealer equipped with a conventional RTA heating device. Diffusion-activation anneal sequence can be conducted multiple times and the respective anneal processes can be placed at different positions within the fabrication process flow. A single activation anneal can be conducted using multiple consecutive anneals to increase its cumulative anneal time. For instance, achieving cumulative anneal duration of several microseconds using nSec Laser Annealing could be accomplished through a plurality of consecutive nSec anneals. If the trace of anneal temperature versus time has a triangular shape, such anneal is referred to as spike anneal. It is customary to specify a spike anneal in terms of its peak temperature and the duration spent above 50° C. below the peak.

In some embodiments, the diffusion anneal is the RTA spike anneal at 1000° C. with the duration spent above 950° C. of 1.5 seconds and the activation anneal is a mSec laser spike anneal (LSA) anneal at 1200° C. plus or minus 25° C. with a cumulative duration spent above 1150° C. plus or minus 25° C. of about 0.5 msec.

The PFET regions 140 have the maximum Ge percentage at around 55 at. % plus or minus 5 at. % and are in-situ doped with boron (B) to about $10^{21}$ atoms/cm$^3$ or, equivalently, to about 2 at. %. The Ge and B concentrations are graded underneath spacer 130 from about 20 at. % to about 55 at. % and from about $10^1$ atoms/cm$^3$ to about $10^{21}$ atoms/cm$^3$, respectively.

The selected diffusion-activation sequence allowed for achieving bulk S/D electrical resistivity of less than $4 \times 10^{-4}$ Ωcm for both NFET and PFET S/D doped material. Bulk S/D resistivity is typically assessed using blanket epitaxial films exposed to the selected anneal sequence. Transistor series S/D resistance normalized to its channel effective width can be measured directly and it contains contributions from all S/D portions including those with varying composition. In order to extract the series S/D resistance, the transistor "on" resistance $R_{on}$ is first partitioned into a gate-modulated component representing channel "on" resistance $R_{ch}$ and other external parasitic resistance $R_{EXT}$ and then the contact resistance $R_c$ and contact metal stub resistance $R_M$ components are subtracted from the parasitic resistance $R_{EXT}$ yielding S/D series parasitic resistance $R_{epi}$. The selected diffusion-activation sequence allowed for achieving the extracted series S/D resistance normalized to channel effective width of less than about 100 Ωμm per NFET or PFET or, equivalently, less than 50 Ωμm per single source or drain of NFET or PFET.

A contact etch stop layer (CESL) 145 is conformally deposited over the S/D regions 140, spacer 130, and dummy gate structures by an ALD. The CESL 145 is made of a dielectric like silicon nitride (SiN) or low-k alternative such as SiCO and SiBCN. The entire structure is then filled with an interlayer dielectric (ILD) 190 like silicon dioxide (SiO2) by a process like chemical vapor deposition (CVD) or spin-on coating and polished to the top of the dummy gates by a chemical mechanical process (CMP).

The dummy gate stack material is selectively removed from the exposed gates forming gate cavities in between spacers 130. The materials within the gate cavities, i.e. within the spacers 130, are pulled. A dry etch or exposure to ammonium hydroxide (NH$_4$OH) at higher than room temperature can be used for pulling polysilicon dummy gate material. Any dummy gate dielectric can be removed using a solution of hydrofluoric acid (HF) or dry chemical oxide etch. In the case of nanosheets or wires, the individual nanosheets or wires can be released by removing exposed sacrificial material, typically SiGe with a high Ge at. %, placed in between them. This can be accomplished by a suitable dry or wet etching process that etches a high-Ge-content SiGe faster than a low-Ge-content SiGe or pure Si. A high-k dielectric 160 layer is formed over the channels and on the interior surfaces of the gate cavity/spacer 130. Forming high-k dielectric layer may include channel surface oxidation, deposition, and annealing. Channel surface oxidation may include surface cleaning, chemical oxidation, and/or thermal oxidation to form an ultra-thin interfacial layer (IL) of silicon oxide or oxynitride. High-k deposition can be conducted in a suitable ALD reactor at relatively low deposition temperature without thickening IL layer. High-k annealing can be performed after or during high-k deposition and/or after forming a sacrificial cap material over the high-k dielectric layer 160. High-k annealing is required to improve material properties of high-k dielectric layer 160. In some embodiments, the high-k annealing includes a conventional RTA anneal performed at a temperature higher than 900° C. for several seconds. While the purpose of this anneal is to improve the high-k reliability characteristics and to adjust a transistor threshold voltage, it falls into the category of diffusion anneals that may diffuse and de-activate dopants of S/D regions 140. In some embodiments, a high-temperature activation anneal is performed after the RTA high-k annealing to re-activate the dopants of S/D regions 140. To put it differently, some of the anneals in diffusion-activation anneal sequence can be conducted in the RMG module with an additional benefit of improving material properties of high-k dielectric layer 160. Importantly, the peak temperature of the activation anneal in RMG module may limit the concentration of Ge in PFET S/D regions 140 as alluded above. The thickness and composition of the high-k dielectric may vary depending on the transistor type (e.g. NFET versus PFET) and transistor function (e.g. logic device versus input/output device).

Then there is a deposition of a layer of work function metal 165 over the high-k dielectric 160. Work function metal deposition can be conducted in a suitable ALD reactor at relatively low deposition temperature without damaging high-k dielectric layer 160 or thickening its IL layer. The work function material 165 for the PFETs will be different than the work function material 165 for the NFETs. Different work function materials for the NFETs and PFETs are created by known alternating patterning, opening, etching, and blocking processes. Once the work function metal 165 is formed, the gate stack 160/165 becomes sensitive to high-temperature anneals limiting temperature and duration of such anneals. Typically, the anneal temperature and/or anneal duration are limited by inducing unwanted electrical changes in the gate stack 160/165. In some embodiments, the anneal temperature and/or anneal duration are limited by inducing less than 0.25 Angstrom thickening of gate dielectric equivalent electrical thickness and such anneals are said to be compatible with the temperature-sensitive gate stack.

A deposition, by a process like CVD, of conductive material like tungsten (W) or cobalt (Co) fills the remaining volume of the gate cavities forming a gate metal 170 common to both NFETs and PFETs. Excess of deposited material 160/165/170 is polished off by CMP and the gate stack 160/165/170 is partially recessed to form a gate divot (not shown) for dielectric cap 180. A dielectric cap 180 is deposited into the gate divot. The excess dielectric material 180 is removed by CMP and/or an etch back. The dielectric cap 180 is made of an insulating material similar to the gate spacer material 130 and CESL liner material 145 like SiN, SiBCN, or SiCO and different from ILD material 190. In some embodiments, an ILD cap layer 101 is blanked over the entire structure. The ILD cap layer 101 can be made of a dielectric similar to the layer 190, like SiO2, and deposited by a suitable CVD process.

In some embodiments, the high-k dielectric materials 160 are an oxide, a nitride, and/or an oxynitride. In some embodiments, the high-k dielectric materials 160 have a dielectric constant greater than 4.0. Embodiments of high k dielectrics 160 include but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, and SiNx. Each value of x can vary independently from 0.5 to 3 and each value of y can vary independently from 0 to 2. In some embodiments, a multi-layered dielectric structure 160 comprising different dielectric materials, e.g., silicon dioxide and a high-k gate dielectric, can be formed and used as gate dielectric material layer.

The work function material 165 for the PFETs will be different than the work function material 165 for the NFETs as alluded above. The PFET work function metal layer 165 materials include but are not limited to: titanium nitride (TiN), tantalum nitride (TaN) or ruthenium (Ru). The NFET work function metal layer 165 material include but are not necessarily limited to: TiN, titanium aluminum nitride (TiAlN), titanium aluminum carbon nitride (TiAlCN), titanium carbide (TiC), titanium aluminum carbide (TiAC), tantalum aluminum carbide (TaAlC), tantalum aluminum carbon nitride (TaAlCN) or lanthanum (La) doped TiN, TaN.

Processes of making nonplanar FET structures to this point are known and alternative methods would be apparent to those skilled in the art given this disclosure.

FIG. 2 is a cross section of the nonplanar FET structures 200 after contact trenches 203 are formed through openings formed in the ILD cap layer 101, the ILD layer 190, and the horizontal part of the CESL layer 145. The horizontal part of the CESL layer 145 is punched through in the contact trenches 203 and some S/D region 140 surface material is removed between the spacers/liners 130/145 forming the convex S/D surfaces 230 aligned to the contact trenches 203. The convex S/D surface allows for an enlarged contact area without increasing gate-to-S/D capacitance.

The contact structures or openings in the ILD cap layer 101 are patterned using suitable lithography techniques. The remaining ILD cap material is labeled 201 in the FIG. 2. In some embodiments, the contact openings are printed to be slightly larger than the distance between adjacent spacers/liners 130/145. RIE chemistry is selected to remove the ILD material of layers 101 and 190 selectively to the dielectric material of both spacers/liners 130/145 and the gate cap 180. This approach is known as a self-aligned contact or borderless contact scheme. The RIE chemistry is also selective to the horizontal CESL layer 145 stopping trench etching on the horizontal CESL layer 145. The exposed corners of gate cap 180 maybe clipped 181, as shown in FIG. 2 but not in other Figures, due to their exposure to energetic RIE ions. Proximity of trench 203 to the conductive gate stack 160/165/170 will define transistor gate-to-S/D capacitance. Thinner spacers/liners 130/145 and thinner cap 180 lead to the increased capacitance and degraded transistor switching performance. At the same time, the spacer/liner 130/145 thickness controls the width of contact trench for a given gate pitch and, consequently, the contact area. Thicker spacers/liners 130/145 yield smaller contact area and degraded contact resistance. There is a geometrical trade-off between gate-to-S/D capacitance and contact resistance. A similar geometrical trade-off exists in the other dimension, perpendicular to the cross section shown in FIG. 2, where a longer contact opening 203 will result in an increased gate-to-S/D capacitance but reduced contact resistance. (Note that since the CESL layer 145 is made of materials similar to the spacer 130, in some embodiments, the vertical part of the CESL layer 145 and the space 130 can act in combination to perform a single spacer/liner function 130/145.)

In some embodiments, after etching the trenches 203 selectively to spacers/liners 130/145 and gate cap 180 and stopping on the horizontal CESL liner 145, a RIE chemistry is changed to punch through the horizontal CESL layer 145 and to remove some surface material 210 from the S/D regions 140. In some embodiments, the RIE chemistry is changed again to remove surface material 210 from the S/D regions 140. The amount of removed material 210 depends of the RIE chemistry at that step and the amount of exposure time to the RIE. The surface of the S/D layer 140 is recessed by a depth 220 forming a convex surface 230. In some embodiments, the maximum depth 220 is at least half of trench 203 width. The surface 230 has an increased surface area with respect to the original S/D surface exposed within the contact trench 203. In some embodiments, from 10 to 20 nm of the surface of the S/D layer 140 is etched away 210. In some embodiments, the convex surface 230 area is at least 50% larger than the original S/D surface exposed within the contact trench 203. The exact shape of the remaining S/D surface 230 depends on the RIE chemistry and can be adjusted by experimentation. RIE chemistry can affect directional and isotropic components of etching modifying resultant shape of the etched cavity. The convex shape of S/D surface 230 is aligned with contact trenches 203 and, in some embodiments, aligned with the spacer/liner edges 235. This ensures that entire recess 220 is located within S/D regions 140 and have no effect to gate-to-S/D capacitance. In some embodiments, the S/D surface 230 has a rectangular convex shape, i.e. the RIE removes S/D surface 210 resulting in a recess 220 with a vertical surface and horizontal surface perpendicular to one another. In other embodiments, the S/D surface 230 has a cylindrical-like or curved convex shape. In any case, the convex surfaces 230 are in alignment with the respective contact trenches 203 as a result of the RIE steps. Importantly, recessing of S/D regions removes highly doped S/D material 140. Furthermore, if there is any grading of Ge content in SiGe S/D material 140, recessing of S/D regions removes material with a higher content Ge. Consequently, a direct metal contact to the recessed convex surface 230 suffers from an increased contact resistivity.

Figure 3:
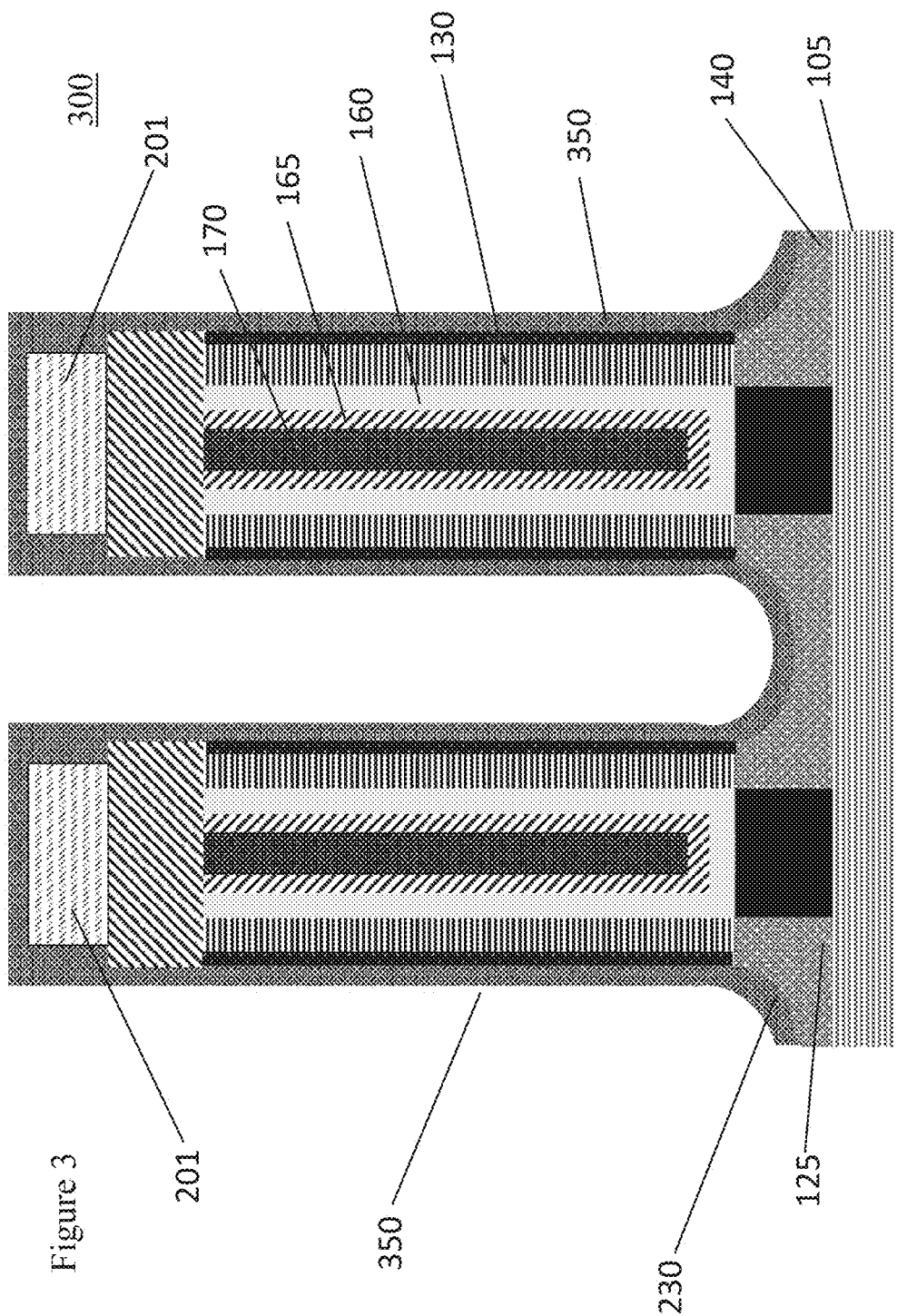
FIG. 3 is a cross section of the nonplanar FET structures after deposition of a layer of germanium dioxide, GeO2.

FIG. 3 is a cross section of the nonplanar FET structures 300 after deposition of a layer of germanium dioxide, GeO2 350. In some embodiments, the layer of GeO2 350 is deposited by ALD to a thickness between 1 nm and 10 nm. In some embodiments, the thickness of the GeO2 layer 350 is about 3 nm. The ALD is performed at a temperature between 150 and 300 degrees Celsius. In some embodiments, the ALD is performed at 200 degrees Celsius plus or minus 10 degrees Celsius. Part of the GeO2 layer 350 is in physical contact with the SiGe material at the convex surfaces 230 of the S/D regions 140.

Using the conformal ALD, the thickness of the GeO2 layer can be controlled to atomic tolerances. As described below, control of the thickness of the GeO2 layer allows very accurate control of the Ge concentration on the surfaces of the S/D regions 140.

Figure 4:
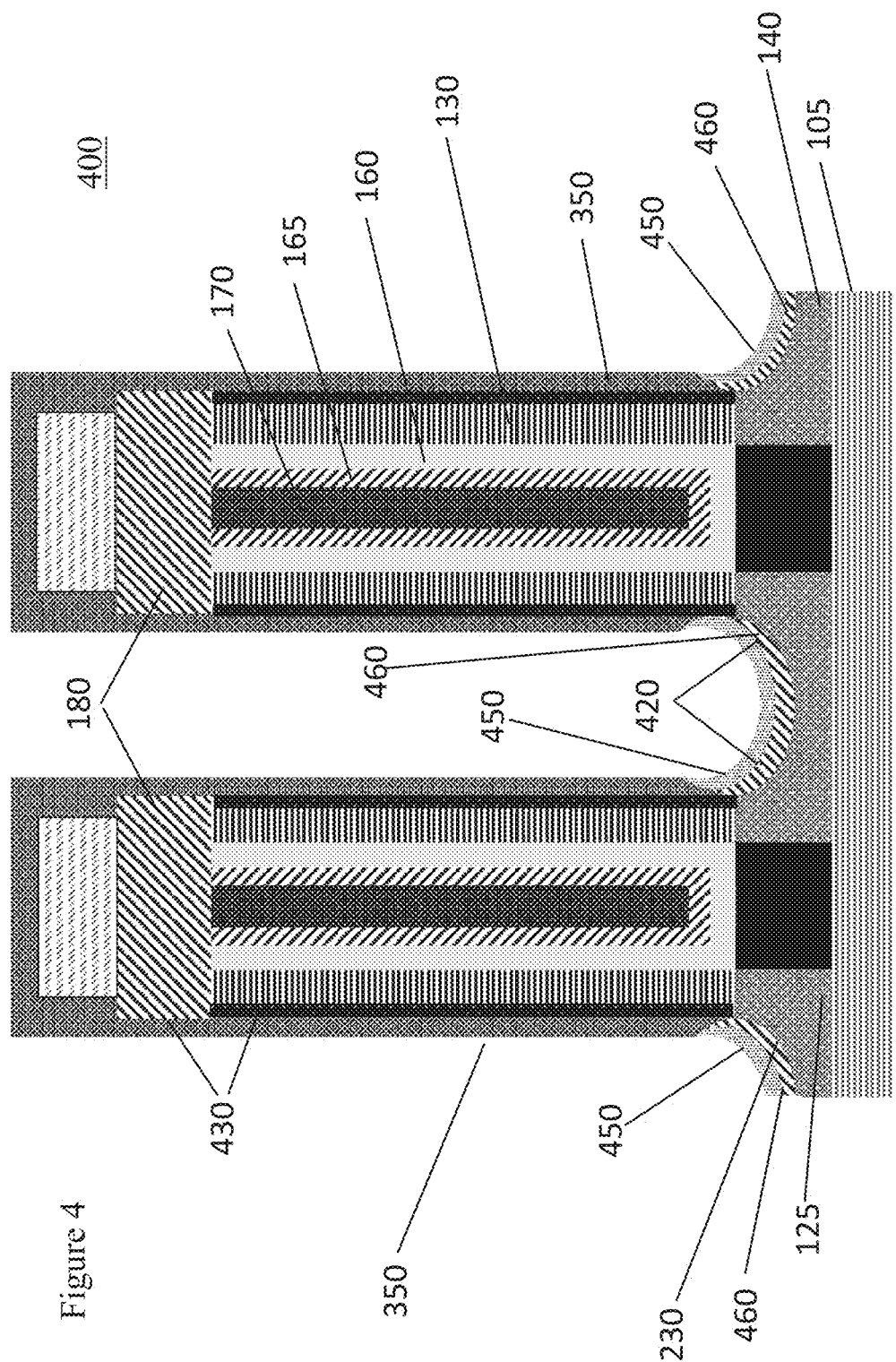
FIG. 4 is a cross section of the nonplanar FET structures after the layer of germanium dioxide reacts with the SiGe material at the surface of the S/D regions.

FIG. 4 is a cross section of the nonplanar FET structures 400 after the layer of GeO2 reacts (or "condenses") with the SiGe. The reaction occurs where the GeO2 layer 350 is in contact, e.g. 420 with the convex surface 230 of the SiGe S/D region. Note that there is no reaction where the GeO2 layer 350 is not in contact with the S/D regions 140, that is where the GeO2 layer is in contact with other materials e.g. at locations like 430. No reaction takes place where the GeO2 layer 350 is in contact 430 with the spacer/liner 130/145 or the sacrificial cap 180.

In order to react GeO2 layer 350 with SiGe S/D 140 at the contact surface 230, heat is applied. The heat is applied to raise the temperature of regions 350 and 140 above a certain threshold for chemical reaction to occur and for a period of time to enable enough time for reaction to proceed. During the reaction, the constituent atoms (e.g. Si, Ge, O) diffuse away from the interface until most of the GeO2 in the GeO2 layer 350 is converted into SiO2 thereby increasing the concentration of germanium (Ge) in the S/D regions 140 in the vicinity of interfaces along the surface 230. Such a process of increasing germanium concentration can be referred to as condensation process.

Figure 5:
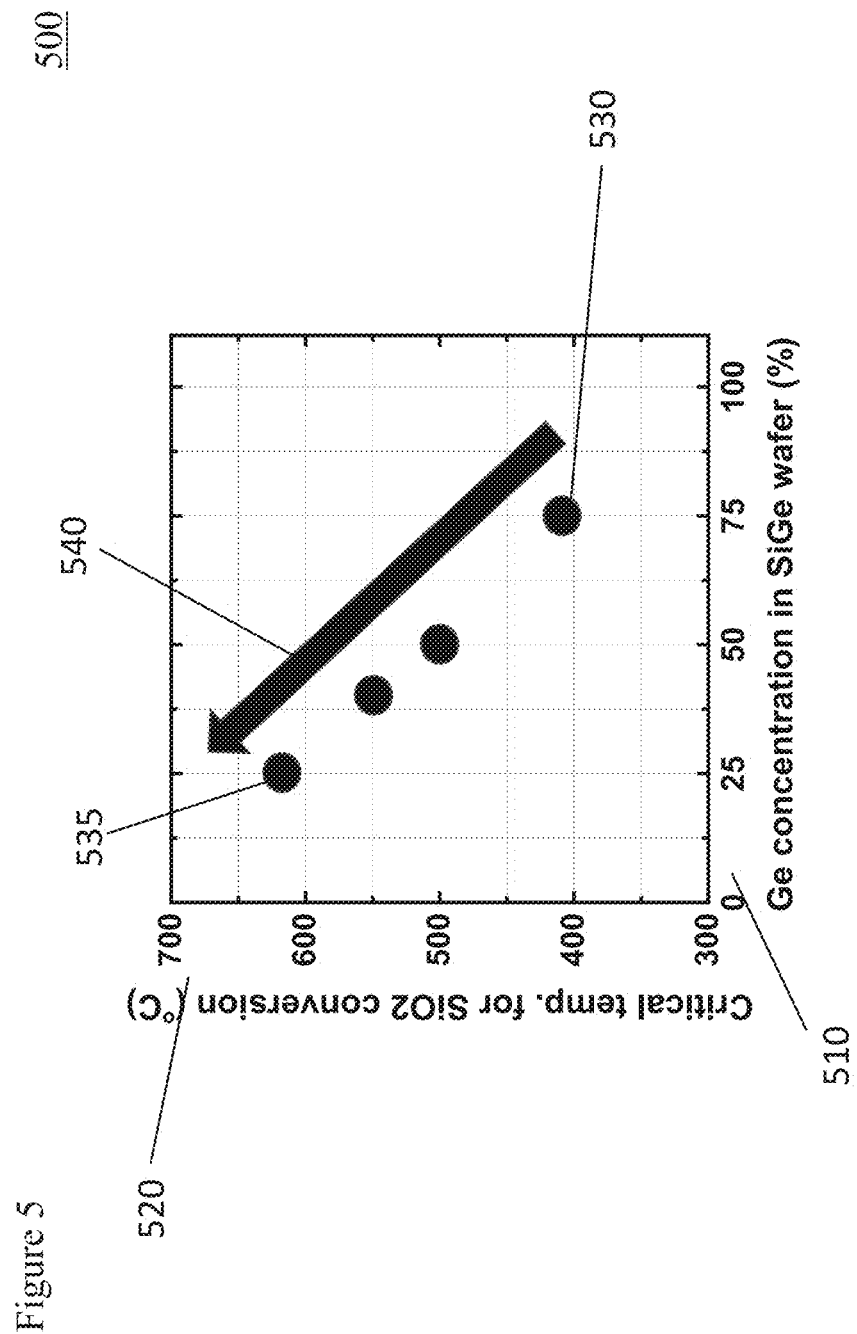
FIG. 5 is a graph showing the critical temperature in degrees Celsius for SiO2 conversions versus the initial percent (%) concentration of Ge in a SiGe wafer.

FIG. 5 is a graph showing the critical or threshold temperature in degrees Celsius for GeO2-to-SiO2 conversions versus the initial percent (%) concentration of Ge in a SiGe wafer. For example, for a given point 530, there is a relatively high initial Ge concentration (about 75%), which means there is about 25% other materials including Si in the wafer surface (S/D regions 140). A lower temperature, e.g. about 400 degrees Celsius, is all that is needed to convert GeO2 into SiO2 in the condensation process. On the other hand, at a point 535 where there is a low, about 25%, Ge concentration (75% Si concentration) in the S/D regions 140, a higher temperature of about 630 degrees Celsius would be required to complete the conversion reaction and consume all the GeO2. Therefore, the temperature required for the condensation process depends upon the initial concentration of Si in the S/D regions 140. The more Si that is initially in the S/D regions 140, the higher the temperature of the reaction needs to be 540.

Without providing any limitation, the chemical mechanism behind this conversion and Ge enrichment is as follows. The Si—O bonding in SiO2 material has a much lower Gibbs free energy than the Ge—O bonding in GeO2 material in a thermal equilibrium state. Consequently, in the presence of a free Si atom, GeO2 will react with Si to form SiO2 releasing one Ge atom. This can be written as a chemical reaction:

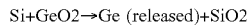
Si+GeO2→Ge (released)+SiO2

Silicon atoms are bonded to Ge atoms in SiGe S/D material 140 but the Si—Ge bonding in the SiGe material has a higher Gibbs free energy than that of the Si—O bonding in SiO2 material. Consequently, silicon atoms at the convex surface 230 of the S/D regions 140 combine with one of the oxygen atoms present in GeO2 material to create a SiO2 layer 450 releasing free Ge. In some instances, a volatile intermediary compound GeOx (x<2) can also be formed during this reaction. This compound may continue reacting with silicon atoms until it is fully converted into SiO2 and/or until it desorbs from the surface of layer 350/450. As the silicon of SiGe combines with oxygen of GeO2 releasing Ge, the atomic percentage of Ge increases in a higher Ge concentration surface/layer 460 of the SiGe S/D regions 140 that forms adjacent to the convex surface/interface 230. This process of migrating Si atoms from the S/D regions 140 into layer 350 and migrating Ge atoms from layer 350 into the layer 460 continues at an elevated temperature suitable for supporting diffusion of both Si and Ge atoms in these adjacent layers and until all the GeO2 350 is consumed. The thickness of the higher Ge concentration surface/layer 460 is thus controlled by the selected conversion temperature, the conversion duration, and the thickness of the GeO2 layer 350. Importantly, the higher Ge concentration surface/layer 460 is created without changing surface area of the convex surface/interface 230 because no new material is added onto the convex surface 230 but rather silicon atoms of existing material 140 near the convex surface 230 are replaced with germanium atoms. Further, as the Si migrates out of the S/D regions 140, a layer of SiO2 450 from about 2 to 5 nm thick (or about 3 nm thick) forms on top of the higher Ge concentration surface/layer 460. The Ge concentration increases during this reaction ("condensing") process to form the higher Ge concentration surface/layer 460 within existing S/D layer 140 aligned with the contact trenches 203 and along the convex surface 230.

In some embodiments, the heat is applied in an inert or reducing gas environment, e.g. nitrogen, argon, helium, hydrogen, or any combination of thereof. The inert or reducing gas environment is used to prevent O2 from oxidizing the SiGe in the S/D regions 140 and any other materials that might be exposed. Conventional semiconductor heating equipment such as hot plates, rapid thermal processors (RTP), and furnaces can be used for this purpose. The structure 300 is raised above the threshold temperature specified in FIG. 5 and to a temperature between 350 and 700 degrees Celsius. The exact anneal temperature depends on Ge concentration in S/D material 140 in the vicinity of the convex surface 230. The heat application duration or anneal duration is typically between several seconds and several hours depending on the anneal temperature. Full conversion of layer 350 is faster at a higher anneal temperature and, thus, the anneal duration can be shorter at higher anneal temperature. Single wafer conventional annealers such as hot plates and RTP enable anneal durations from several seconds to several minutes. Batch annealers such as diffusion furnaces enable longer anneal durations from tens of minutes to several hours.

The temperature-sensitive gate stack 169/165/170 limits the thermal budget of layer 350 conversion and related Ge condensation. A thermal budget refers to the anneal temperature and its duration. The condensation thermal budget is limited by less than few hours at anneal temperatures of less than 450° C., less than tens of seconds at anneal temperatures of less than 500° C., and less than few milliseconds at anneal temperatures of less 900° C. This limitation specifies the minimum Ge content in SiGe S/D material 140 in the vicinity of convex surface 230 for condensation anneals conducted in conventional heating equipment. For instance, SiGe S/D material 140 with 50 atomic percent of Ge needs a conversion temperature of at least 500° C. (see FIG. 5) which is at a borderline of the acceptable thermal budget for the temperature-sensitive gate stack 169/165/170. This is one of several considerations that defined the preferred range for Ge concentration in the bulk of SiGe S/D material 140 at around 55 at. % plus or minus 5 at. %.

A mSec anneal can be included into the condensation anneal sequence to alleviate the thermal budget limitation. The mSec anneal alone cannot fully convert layer 350 due to its short duration from few milliseconds to hundreds of microseconds. At these short durations, Si and Ge atoms cannot migrate more than 1-2 nm away from the interface 420 (see FIG. 4). However, a mSec anneal can assist a conventional anneal process in fully converting layer 350 into layer 450. The mSec anneal at between 700° C. and 900° C. will initiate a rapid interfacial reaction while the conventional annealing at below 500° C. will help migrating Si and Ge atoms away from the interface 420. This annealing sequence can be repeated multiple times to fully convert layer 350 into layer 450 forming the higher Ge concentration surface/layer 460. Addition of mSec annealing steps into the condensation sequence may reduce the required conversion temperature for conventional anneals to below the temperature shown in FIG. 5. This, in turn, may open up the process window with respect to Ge content in SiGe S/D material 140 in the vicinity of convex surface 230.

Millisecond-scale anneals can be conducted in mSec Flash Lamp annealers or mSec Laser Annealing tools. These tools can be used as stand-alone in addition to a separate conventional annealers or can incorporate conventional heating devices (e.g. RTA lamps and hot plates) internally. In the latter case, the wafer may be held at an elevated temperature by conventional heating devices and the wafer front side is periodically exposed to mSec anneal pulses. In one example, the mSec annealer is a mSec laser spike anneal tool equipped with a hot plate, the hot plate temperature is held at 425° C., the mSec anneal peak temperature is about 850° C., the mSec anneal duration above 800° C. is about 200 microseconds, and the mSec anneal is conducted 6 times spaced 1 minute apart.

Figure 6:
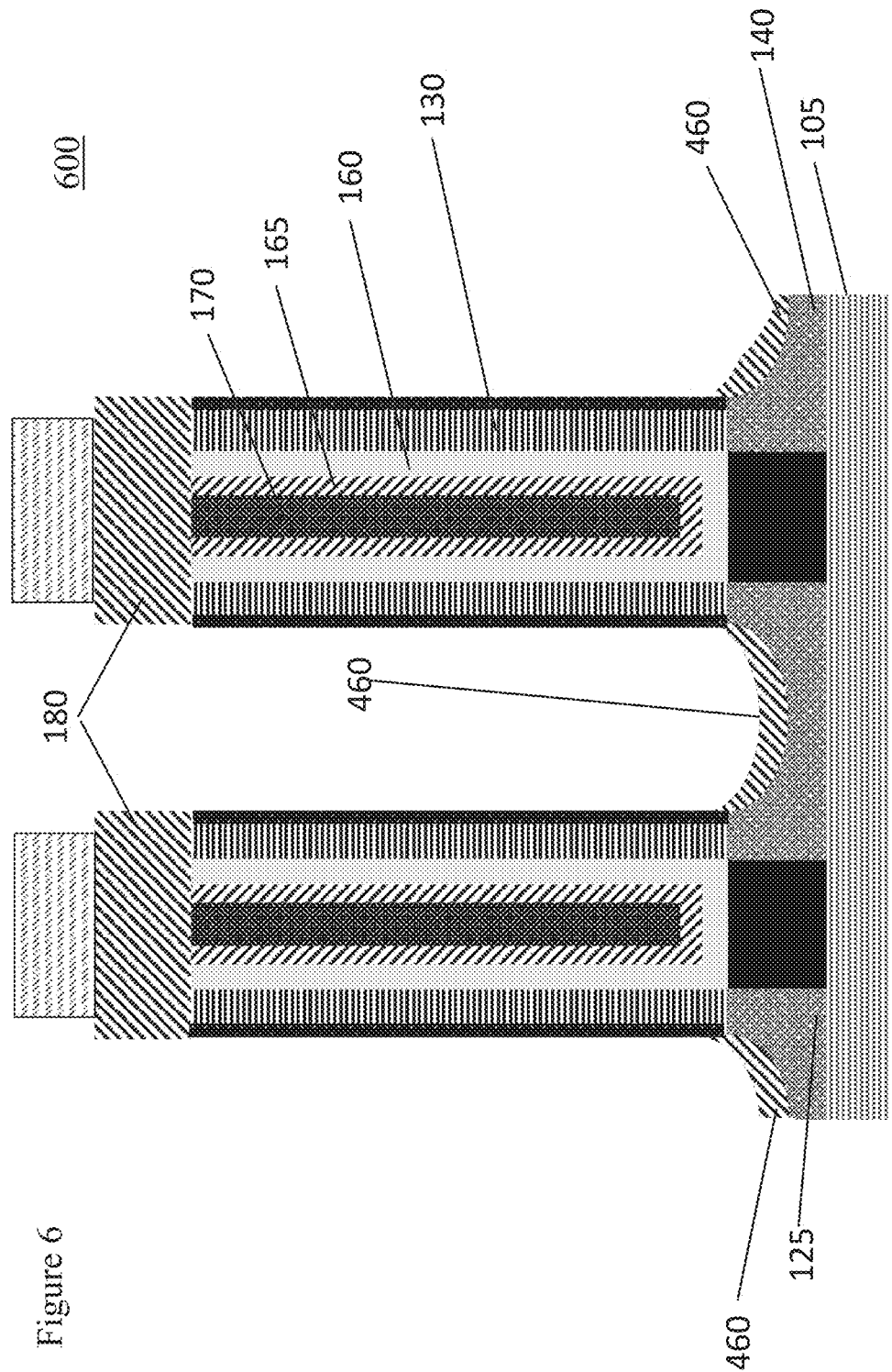
FIG. 6 is a cross section of the nonplanar FET structures after layers of unreacted GeO2 and SiO2 are removed.

FIG. 6 is a cross section of the nonplanar FET structures 600 after the layer of SiO2 layer 450 and unreacted layer 350 are removed. There are various ways of removing the unreacted GeO2 layer 350. In some embodiments, the layer 350 is removed by a polar liquid such as hot water, typically, held at 85° C. There are various ways of removing the SiO2 layer 450 to expose the higher Ge concentration surface/layer 460 in the surface of the S/D regions 140. Preference are given to methods of removing material that do not have much impact onto trenches 203.

The SiO2 layer 450 can be removed by exposure to known solutions like diluted hydrogen fluoride (HF) in de-ionized water, e.g. at a 1% solution. A buffered hydrogen fluoride (BHF) solution can also be used. Alternatively, a dry chemical oxide etching process such as chemical oxide removal (COR) or any other suitable process can be used for removing the SiO2 layer 450. The dry chemical etches may have isotropic and directional components allowing for removing SiO2 layer 450 at the bottom of the contact trenches 203 without excessive etching sidewalls of trenches 203 that are partially composed from ILD material 190 and 201 (in the direction perpendicular to cross section shown in FIG. 6). The solutions, chemistries, and/or their application should be material selective, i.e. able to remove the SiO2 layer 450 and the GeO2 layer 350 on the spacer/liner 130/145 while not damaging the spacer/liner 130/145 or removing the higher Ge concentration surface 460 of the SiGe S/D region 140 or excessively etching sidewalls of contact trenches 203 made of ILD material 190 and 201.

It is noted that the process steps of depositing the GeO2 layer 350, heating, and removing the SiO2 layer 450 can be repeated one or more times. Each time these steps are repeated, the concentration of Ge in the higher Ge concentration surface 460 of the S/D regions 140 will increase. This may be used for reducing the required conversion temperature for condensation anneal sequence to below the temperature shown in FIG. 5 and, in turn, may open up the process window with respect to Ge content in SiGe S/D material 140 in the vicinity of convex surface 230.

The functional purpose of the resultant higher Ge concentration surface/layer 460 in the surface of the S/D regions 140 is to decrease the contact resistivity between metallic conductors that will be placed into trenches 203 (described below) and the semiconducting S/D material 140. The contact resistivity between a semiconductor material and a metallic conductor depends on the Schottky energy barrier height that may exist at the interface and the concentration of free electrical carriers in the adjacent semiconductor material. For a lower Schottky energy barrier, the contact resistivity is lower. For a higher free electrical carrier concentration, the contact resistivity is lower. PFET contact resistivity can be made lower by increasing Ge content in SiGe semiconductor due to a reduction of Schottky energy barrier at the interface. SiGe-based semiconductors with higher Ge content exhibit effect of pinning adjacent metal Fermi level to the semiconductor valence band thereby reducing PFET contact Schottky energy barrier. In some embodiments, the concentration of Ge in the higher Ge concentration surface/layer 460 increases up to between 60 to 95 percent without substantially changing shape and surface area of convex surface 230 and without any detrimental effects to S/D series resistance $R_{epi}$ and gate-to-S/D capacitance.

It is also noted that, the invention works more efficiently with PFET structures due to the effect of metal Fermi level pinning to the valence band in SiGe semiconductors with higher Ge content. The same effect may be detrimental for NFET contact structures. Accordingly, forming the higher Ge concentration surface/layer 460 on NFET structure is typically avoided. This can be done by conventional masking techniques where a dielectric liner is first deposited over all devices prior to forming layer 350 and then patterned and removed from PFET devices. However, the present invention allows for a selective reaction of layer 350 with S/D material 140 in such a way that PFET S/D material 140 forms the layer 460 and NFET S/D material 140 does not. This can be accomplished by selecting condensation anneal sequence to be below the conversion/condensation threshold for NFET S/D material 140 and above the conversion/condensation threshold for PFET S/D material 140.

In some embodiments, the NFET S/D material 140 is silicon doped with phosphorus, the PFET S/D material 140 is $Si_{0.45}Ge_{0.55}$ (Ge content is 55 at. % plus or minus 5 at. %.) doped with boron, the conversion/condensation sequence does not exceed 800° C. for mSec annealing and 450° C. for conventional annealing, the resultant higher Ge concentration surface/layer 460 on PFET S/D material 140 has Ge content at 70 at. % plus or minus 5 at. %, and layer 460 is absent on NFET S/D material 140.

Increasing Ge content in the layer 460 has a positive effect onto the Schottky energy barrier but may have a negative effect onto the free hole carrier concentration in the layer 460, thus, negating some or all benefits from reducing the Schottky energy barrier. This is due to the boron having a low solid solubility in the high Ge concentration SiGe material 460. While boron is a preferred p-type dopant for low Ge concentration SiGe material, a high-solubility p-type dopant needs to be added to the material 460 and activated to increase the hole carrier concentration in material 460. Gallium (Ga) and Aluminum (Al) are high-solubility dopants for high Ge content SiGe material. Other p-type dopants such boron (B), indium (In), and thallium (Tl) can be added in addition to a high-solubility dopant. Ga is typically preferred over Al because Al may form a stable aluminum oxide at the exposed semiconductor surface that is harder to remove than the corresponding Ga oxide. The amount of the p-type dopant that is added to layer 460 at this step exceeds its maximum solid solubility in SiGe material and dynamic, nonequilibrium dopant activation techniques are utilized to maximize the concentration of hole carriers in material 460, as described below.

Figure 7:
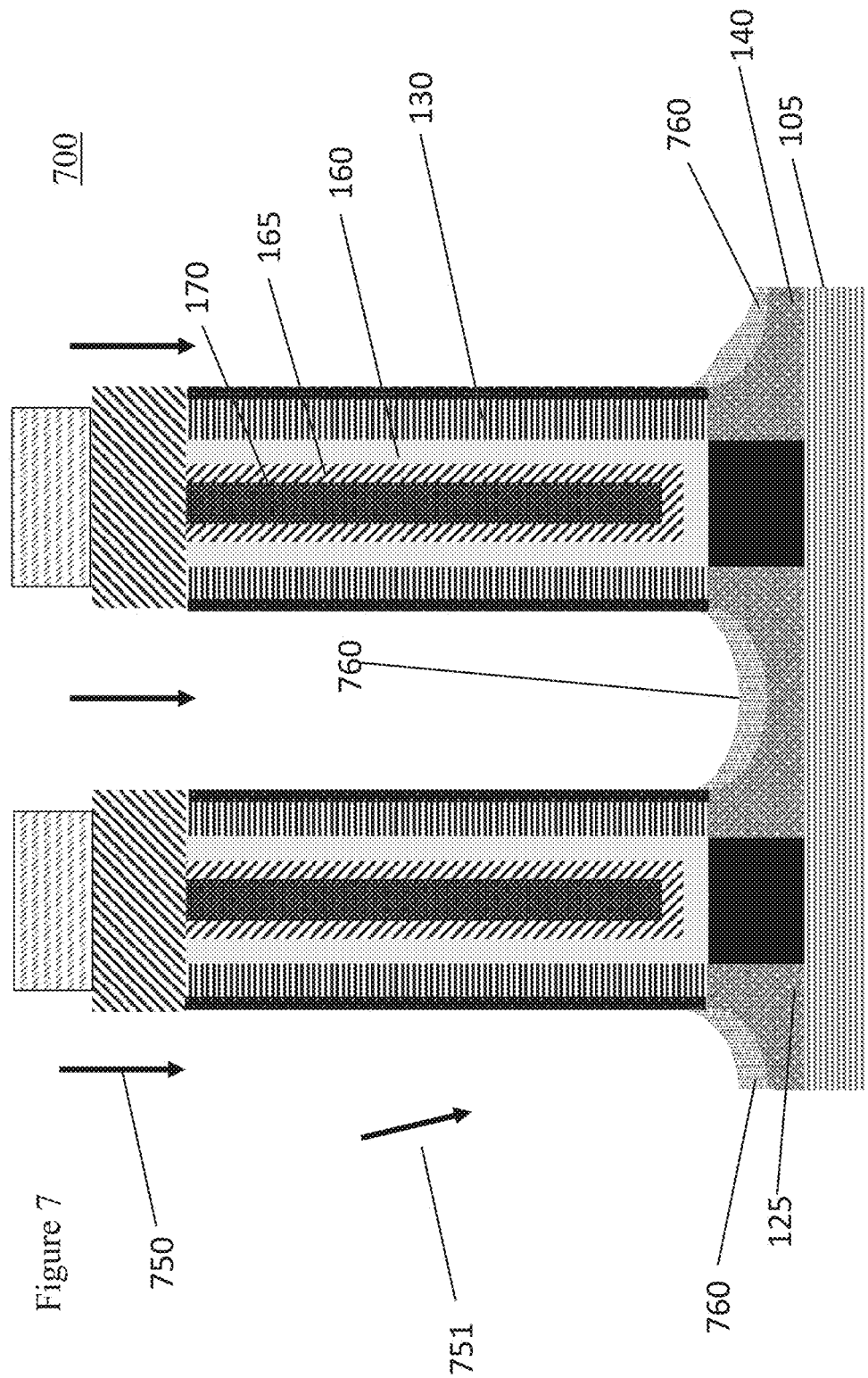
FIG. 7 is a cross section of the nonplanar FET structures with the S/D regions being implanted.

FIG. 7 is a cross section of the nonplanar FET structures 700 after the PFET S/D regions 140 are implanted 750 with a high-solubility p-type dopant such gallium (Ga) or aluminum (Al). (Note that when the convex region is rectangular, the implant 751 is at a slight tilt angle to vertical to allow implantation of the vertical surface of the convex surface 230.) NFET S/D regions 140 are not shown and are blocked with a block mask. Gallium and/or aluminum ions are implanted (750, 751) into the S/D regions 140 by any known technique including but not limited to ion, plasma, and monolayer implantation. The implanted surface layer 760 is formed within layer 460 of the S/D region 140. In some embodiments of the invention, the layer 760 is amorphous due to the induced implantation damage. The high-solubility dopant concentration in layer 760 may exceed $1 \times 10^{21}$ cm$^3$ (equivalent to approximately 2 to 3 atomic percent). In some embodiments of the invention, the high-solubility dopant concentration ranges from 2 atomic percent to 20 atomic percent with from 4 at. % to 10 at. % being more preferred. The high-solubility dopant implantation doses are preferably from $1\times10^{15}$ ions/cm$^2$ to $5\times10^{15}$ ions/cm$^2$ and the high-solubility dopant implantation energy is preferably from 1 keV to 10 keV. In some embodiments, the high-solubility dopant is gallium (Ga). A larger Ga atom has a reduced lateral straggle over a lighter Al atom. Reduced lateral straggle decrease probability of implanted ion to straggle underneath the spacer/liner 130/145 into channel region 120. While the implantation step is shown after removal of SiO2 layer 450, it can be conducted after removal of remaining unreacted GeO2 layer 350 and before removal of SiO2 layer 450. In this case, the implantation energy is selected to be sufficient for ions to penetrate through layer 450. In some embodiments, the ion implantation energy is from 4 keV to 10 keV. If a tilted implantation 751 is used, the tilt angle is selected to avoid any shadowing by trench 203 walls and is typically between 1 and 10 degrees. Tilted implant 751 can be conducted at 4 different twist angles (e.g. at 0, 90, 180, 270 degrees of twist) to implant into 4 sidewalls of the surface 230.

Figure 8:
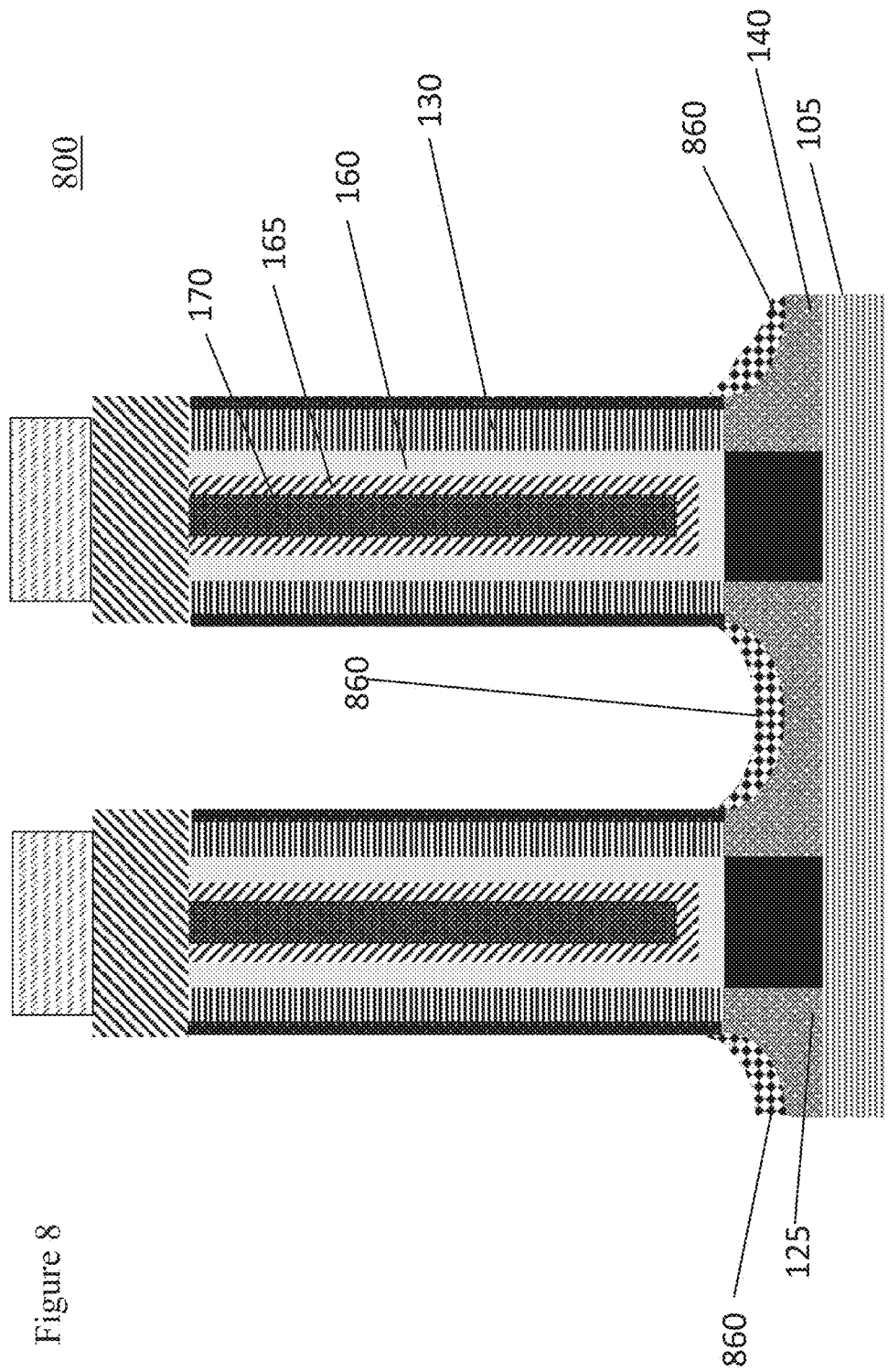
FIG. 8 is a cross section of the nonplanar FET structures after the implanted PFET S/D regions are annealed and activated forming regions with a high concentration of hole electrical carriers.

FIG. 8 is a cross section of the nonplanar FET structures 800 after the implanted PFET S/D regions 760 are annealed and activated forming regions 860 with a high concentration of hole electrical carriers. Dopant activation process at this step relies on non-equilibrium activation techniques as opposite to the equilibrium thermal activation of dopants described above with respect the S/D material 140. The non-equilibrium activation techniques employ a dopant trapping into growing crystal lattice and a quick temperature quenching to preserve trapped dopants. Fast temperature quenching reduces the dopant migration, thus, preventing agglomeration of excess dopants into clusters and precipitates. This results into a metastable or supersaturated semiconductor-dopant alloy with a homogenous distribution of dopant in excess of its maximum solid solubility limit. Such metastable or supersaturated semiconductor-dopant alloy exhibits and an increased concentration of free electrical carriers (holes in the case of p-type layer 860) thereby reducing the contact resistivity.

In some embodiments, the dopant trapping in the growing crystal lattice is conducted through fast solid phase epitaxy (SPE) induced by exposing structure 700 to a mSec anneal. The peak temperature of mSec anneal is from 700° C. to 850° C. and its duration is from 100 microseconds to several milliseconds. It should be noted that this anneal is compatible with the temperature-sensitive stack 160/165/170 while enabling full re-growth of amorphous layer 760. In some embodiments, the mSec anneal is a mSec laser spike anneal at 800° C. peak temperature and the duration spent above 750° C. of about 150 microseconds. The speed of re-growth epitaxial front is in excess of 0.1 mm/sec providing for an efficient dopant atom trapping into growing SiGe lattice of the layer 860. The temperature quenches with the speed of about 500,000° C./sec preserving trapped dopants and resultant metastable or supersaturated dopant-semiconductor alloy of the layer 860.

In other embodiments, the dopant trapping in the growing crystal lattice is conducted through a super-fast liquid phase epitaxy (LPE) induced by exposing structure 700 to a nSec laser anneal. The peak temperature of nSec laser anneal is selected to be above the melting point of amorphous SiGe layer 760 and its duration is selected to be from 20 nsec to 500 nsec. The temperature of structure 700 rises with the speed of about 10,000,000,000° C./sec converting the amorphous layer 760 directly into liquid. Such liquification of amorphous material has a melting point of about 150-200° C. lower than that of corresponding crystalline SiGe. For SiGe layer 760 with 70 at. % Ge, the melting temperature is estimated to be around 1000° C. Accordingly, the peak nSec anneal temperature is selected from 900° C. to 1200° C. depending on exact Ge content in layer 760. It should be noted that this nSec laser anneal is compatible with the temperature-sensitive stack 160/165/170. After melting, the temperature quenches with the speed of about 5,000,000,000° C./sec causing epitaxial solidification of the liquid semiconductor material with the epitaxial front speed of about 1 m/s. A super-fast speed of the epitaxial front allows for very efficient dopant trapping in growing SiGe crystal lattice of the layer 860. In addition, such super-fast temperature quenching preserves the trapped dopants and the resultant metastable or supersaturated dopant-semiconductor alloy of the layer 860.

A similar surface implantation and activation contact sequence can be repeated for NFET devices using n-type dopants (e.g. phosphorus, arsenic, and/or antimony). During n-type dopant implantation step, the PFET devices will be blocked with a suitable block mask. The implantation-activation contact sequences for NFET and PFET devices can be performed sequentially, e.g. the NFET contact sequence performed first followed by the PFET contact sequence, or only the implantation step can be performed sequentially with a single activation step applicable for both NFET and PFET implantation and activation contact sequence. In the latter case, the SPE/LPE-inducing anneal may need to be conducted at a higher temperature to ensure a full re-crystallization of NFET contact region (not shown).

Figure 9:
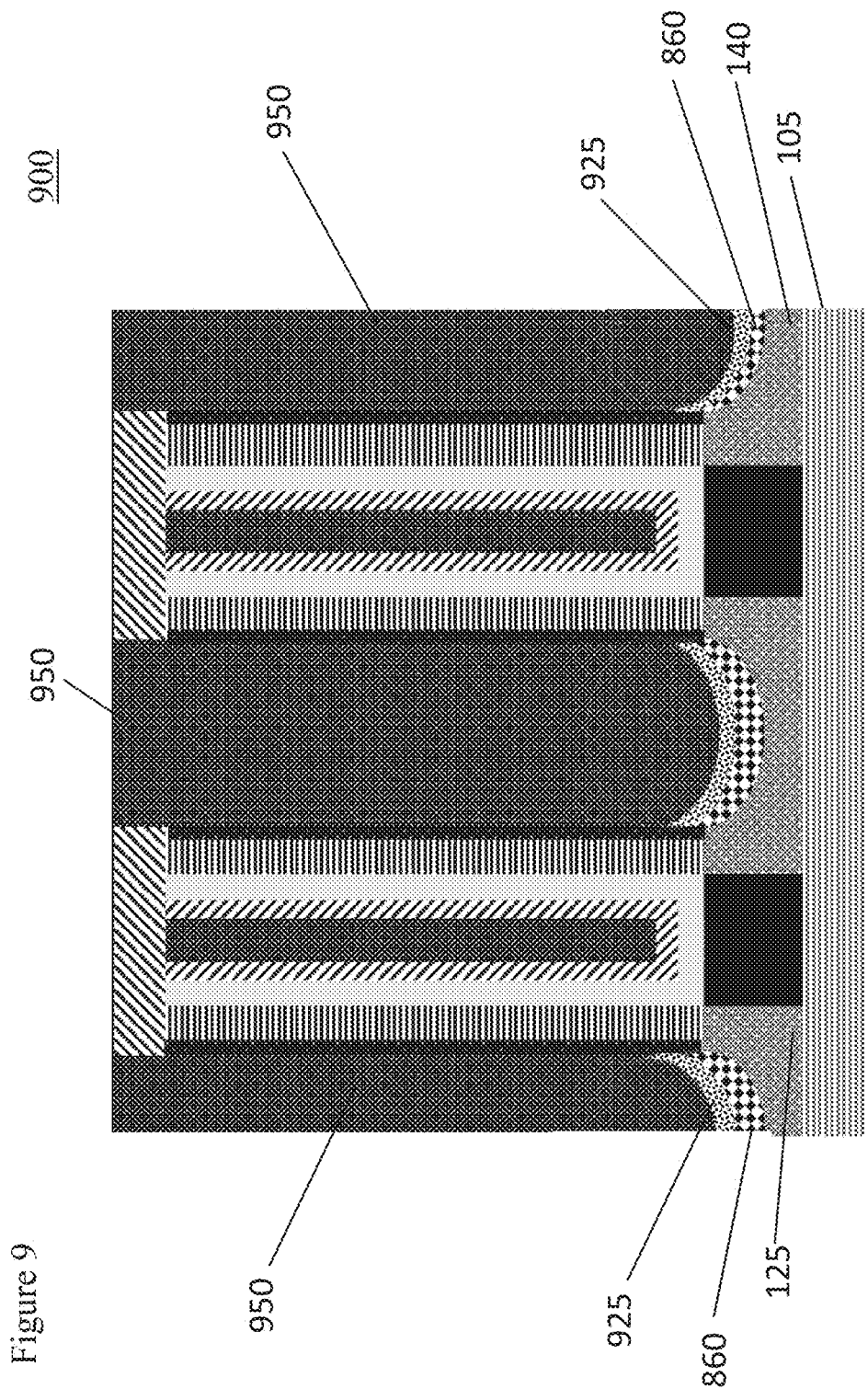
FIG. 9 is a cross section of the nonplanar FET structures after forming metallic contacts.

FIG. 9 is a cross section of the nonplanar FET structures 800 after forming metallic contacts to layer 860. A contact structure can be formed by depositing or forming a conductive material 925 within the trench 203. In this manner, the electrical contact is formed between the material 925 and the semiconducting layer 860.

The material 925 can be formed or deposited using known metallization techniques. In some embodiments of the invention, the exposed surface of layer 860 is cleaned to remove any residual dielectric or poorly conducting films such as native oxides and the trench 203 is filled with a conductive material 925. In some embodiments, the conducting material 925 may include a metal (e.g., titanium, tantalum, nickel, cobalt, zirconium, ruthenium, or rhodium), a conducting metallic compound material (e.g., titanium silicide or germanide, titanium nitride, tantalum nitride, tantalum carbide, titanium carbide, cobalt silicide or germanide, or nickel silicide or germanide), a conductive carbon, or any suitable combination of these materials. In some embodiments of the invention, the conductive material 925 includes a reactive metal and a barrier metallic liner. The reactive metal covered by the barrier metallic liner can be exposed to a silicidation anneal to form a conductive metallic compound at the interface of layer 860 such as metal germanosilicide. In some embodiments of the invention, the reactive metal is titanium (Ti), the barrier metallic liner is titanium nitride (TiN), and the interfacial compound formed by the silicidation anneal is titanium germanosilicide (TiSiGe). Other examples of reactive metal and barrier metallic liner include tantalum nitride and tantalum (TaN/Ta), and nickel and titanium nitride (Ni/TiN). A contact conductor 950 is then deposited into contact trenches 203. The contact conductor is typically an elemental metal such tungsten, cobalt, ruthenium, rhodium, zirconium, copper, aluminum, and platinum. In some embodiments of the invention, the contact conductor is cobalt or tungsten. In some embodiments of the invention, the conductive material 925 and the contact conductor 950 are overfilled above a top surface of the trench 203, forming an overburden that is removed using, for example, CMP. During CMP, a portion or all ILD cap 201 can be removed stopping on the dielectric cap 180. As alluded above, the structure 900 can be annealed with a low thermal budget silicidation anneal to initiate a surface reaction between a conductive material 925 and the semiconductor-dopant alloy of layer 860. The surface reaction produces a thin layer (e.g. 1-5 nm thick) of metallic compound such as metal silicide and/or germanide. The thermal budget of such contact anneal is chosen to be low enough to preserve the metastable semiconductor-dopant alloy of layer 860 and temperature sensitive gate stack 160/165/170. In some embodiments of the invention, the silicidation anneal is a mSec anneal with a peak temperature of 800° C. and the duration above 750° C. of about 100 microseconds. This anneal can be conducted after depositing conducting material 925 or later in the process flow, e.g. after forming entire structure 900. Further, this silicidation anneal may replace SPE-inducing anneal in implantation-activation contact PFET sequence combining both functions: re-growing amorphous layer 760 into metastable semiconductor-dopant alloy 860 and simultaneously forming interfacial metallic compound between layers 860 and 925.

While not shown for ease of illustration, additional contacts (e.g., gate contacts) can be similarly formed in the semiconductor structure 900 using known fabrication workflows. The metallic contacts to S/D regions and gates of respective NFET and PFET devices can be wired into useful logic circuits, e.g. CMOS circuits, using known metallization workflows.

The present invention enables a convex shape of the metal-SiGe contact (the interface between layers 925 and 860). This shape provides an increased interfacial contact area without any penalties to S/D series resistance $R_{epi}$ and gate-to-S/D capacitance. The metastable SiGe-dopant alloy with increased Ge content of layer 860 is formed within recessed S/D region and aligned with the contact trenches 203. The metastable SiGe:B:Ga/Al alloy of layer 860 enables a low p-type contact resistivity between metal conductors 950/925 and PFET S/D regions 140. In some embodiments of the invention, the p-type contact resistivity between the PFET S/D regions 140 and the contact conductor 950 is equal to or lower than $1\times10^9$ $\Omega cm^2$ including contact resistivity of any interfaces between unipolar semiconductor layers (e.g. between layer 860 and region 140) and different metallic compounds that may be present within and in between layers 925 and 950. Both the increased contact area and the decreased contact resistivity results in substantially reduced contact resistance of nonplanar PFET devices. When contact resistance is normalized to nonplanar transistor channel effective width, the resultant PFET contact resistance $R_c$ is reduced to be less than half of PFET S/D series parasitic resistance $R_{epi}$ or, in some embodiments, to less than about 25 $\Omega\mu m$ per a single source or drain PFET contact with 15 nm-wide trench. The nonplanar PFET device can be a FinFET device or a stacked nanosheet/nanowire device.

Figure 10:
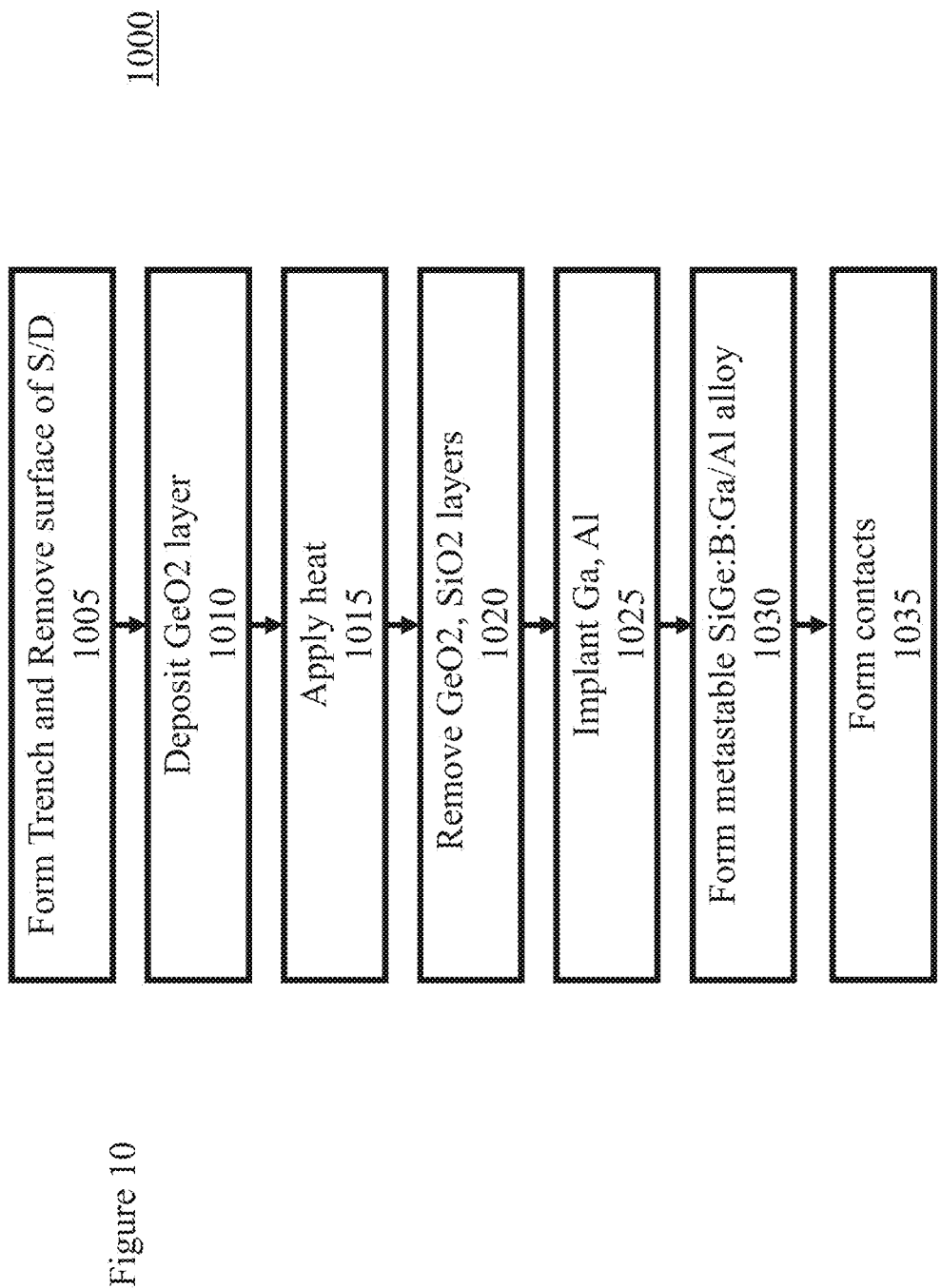
FIG. 10 is a flow chart of one method of making the nonplanar PFET device/structure with reduced contact resistance.

FIG. 10 is a flow chart of one method 1000 of making the nonplanar PFET device/structure with reduced S/D contact resistance. Additional details describing each step are given above.

The method 1000 begins with step 1005 of forming contact trenches 203 and removing material 210 from the surface of the S/D region 140.

Step 1010 deposits a layer of GeO2 350 on the remaining surface 230 of S/D region 140.

Heat is applied in step 1015, e.g. by a hot plate and a laser spike anneal (LSA) and the reaction with the GeO2 350 in contact with the remaining surface 230 of the S/D layer 140 increases the Ge concentration in the S/D region 140 forming a higher Ge concentration surface/layer 460. A layer of SiO2 450 on the surface 460 of the S/D region 140 also forms.

In step 1020, the unreacted GeO2 layer 350 and the SiO2 layer 450 are removed.

In step 1025 Ga and/or Al is implanted in the S/D region 140 to change the higher Ge concentration surface/layer 460 into an implanted surface layer 760 of the S/D region 140.

In step 1030 the implanted surface layer 760 of the S/D region 140 is converted into a metastable or supersaturated dopant-semiconductor alloy 860 with increased free hole concentration.

In step 1035 external metallic contacts 925/950 to the metastable or supersaturated dopant-semiconductor alloy 860 are formed using standard techniques.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A nonplanar PFET comprising:
    a substrate;
    one or more nonplanar channels disposed on the substrate;
    a gate stack enclosing each of the nonplanar channels;
    a first source/drain (S/D) region disposed on the substrate on a source side of each of the nonplanar channels and a second S/D region disposed on the substrate on a drain side of each of the nonplanar channels, each of the first and second S/D regions made of first layer of silicon-germanium (SiGe) with a first concentration of germanium (Ge) and a second layer of SiGe with a second concentration of Ge and a surface, the second layer of SiGe being directly on the first layer of SiGe, the surface being doped with a high-solubility dopant with a dopant concentration between 2 atomic percent to 20 atomic percent; and one or more contact trenches, the contact trenches having side walls, each contact trench filled with a metal providing a metallic electrical connection to the surface of one of the first and the second source/drain (S/D) regions, respectively, through a barrier metallic liner, wherein the surface of each of the second layers of SiGe is aligned with one of the contact trenches so that the metallic electrical connection, the barrier metallic liner, and the surface are within the respective S/D region and do not extend past the sidewalls toward the gate stack, the surface having a convex shape and the second concentration of Ge being higher than the first concentration of Ge and wherein the convex shape of the surface of each of the second layers of SiGe is in electrical contact with one of the metallic electrical connections.

2. A nonplanar PFET, as in claim 1, where the thickness of the second layer of SiGe is between 2 nanometers (nm) and 10 nm.

3. A nonplanar PFET, as in claim 1, where a contact resistivity between the metallic electrical connection and one of the first and second S/D regions is less than $10^{-9}$ $\Omega cm^2$.

4. A nonplanar PFET, as in claim 1, where a contact resistance is less than half of PFET S/D series parasitic resistance $R_{epi}$.

5. A nonplanar PFET, as in claim 1, where a contact resistance normalized to an effective width of the nonplanar channel between the S/D and metallic electrical connection is less than 25 $\Omega \mu m$ for 15 nanometer width of metallic electrical contact.

6. A nonplanar PFET, as in claim 1, where the first concentration of Ge is between 45 and 75 atomic percent Ge and the second concentration of Ge is between 60 and 95 atomic percent Ge.

7. A nonplanar PFET, as in claim 1, where the second layer of SiGe is doped with the high-solubility dopant.

8. A nonplanar PFET, as in claim 7, where the high-solubility dopant is one of gallium (Ga) or aluminum (Al).

9. A nonplanar PFET, as in claim 7, where the high-solubility dopant is homogeneous and has a concentration of between 4 and 10 atomic percent in the second layer of SiGe.

10. A nonplanar PFET as in claim 1, where the barrier metallic liner comprises one or more of the following metals: metal germanosilicide, titanium, cobalt, nickel, titanium nitride, tantalum nitride, and a silicide.

11. A nonplanar PFET, as in claim 10, where the metallic electrical connection is directly disposed on the barrier metallic liner.

12. A nonplanar PFET, as in claim 11, where the metal includes one or more of the following: an elemental metal, tungsten, cobalt, ruthenium, rhodium, zirconium, copper, aluminum, or platinum.

13. A CMOS circuit with a plurality of nonplanar PFETs and NFETs comprising:

a substrate;

one or more nonplanar NFET and PFET channels disposed on the substrate;

NFET and PFET gate stack enclosing each of the respective NFET and PFET nonplanar channels;

a first source/drain (S/D) region disposed on the substrate on a source side of the respective nonplanar channel and a second S/D region disposed on the substrate on a drain side of the respective nonplanar channel, the first and second NFET S/D regions are made of silicon (Si) and the first and second PFET S/D regions are made of a first layer of silicon-germanium (SiGe) with a first concentration of germanium (Ge) and a second layer of SiGe with a second concentration of Ge and a surface, the second layer of SiGe being directly on the first layer of SiGe, the surface being doped with high-solubility dopant with a dopant concentration between 2 atomic percent to 20 atomic percent; and one or more contact trenches, the contact trenches having side walls, each contact trench filled with a metal providing a metallic electrical connection to the surface of one of the first and the second source/drain (S/D) regions of PFETs and NFETs, respectively, through a barrier metallic liner, wherein the surface of each of the second layers of SiGe is aligned with one of the contact trenches, so that the metallic electrical connection, the barrier metallic liner, and the surface are within the respective S/D region and within the contact trench, the surface having a convex shape and the second concentration of Ge being higher than the first concentration of Ge, and wherein the convex shape of the surface of each of the second layers of SiGe is in electrical contact with one of the metallic electrical connections.

14. The CMOS circuit, as in claim 13, where the thickness of the second layer of SiGe is between 2 nanometers (nm) and 10 nm.

15. The CMOS circuit, as in claim 13, where a contact resistivity between the metallic electrical connection and one of the first and second S/D regions is less than $10^{-9}$ $\Omega cm^2$.

16. The CMOS circuit, as in claim 13, where a contact resistance between one of the first and the second source/drain (S/D) regions of PFETs and NFETs and one of the metallic electrical connections, normalized to an effective width of the nonplanar channel, is less than 25 $\Omega \mu m$ for 15 nanometer width of the respective metallic electrical contact.

17. The CMOS circuit, as in claim 13, where the first concentration of Ge is between 45 and 75 atomic percent Ge and the second concentration of Ge is between 60 and 95 atomic percent Ge.

18. The CMOS circuit, as in claim 13, where the dopant concentration is between 4 atomic percent to 10 atomic percent.

19. The CMOS circuit, as in claim 18, where the high-solubility dopant is one of gallium (Ga) or aluminum (Al).

20. A CMOS circuit with a plurality of nonplanar PFETs and NFETs comprising:

a substrate;

one or more nonplanar NFET and PFET channels disposed on the substrate;

one or more NFET and PFET gate stacks enclosing the respective NFET and PFET nonplanar channels;

a first source/drain (S/D) region disposed on the substrate on a source side of the respective nonplanar channel and a second S/D region disposed on the substrate on a drain side of the respective nonplanar channel, the first and second NFET S/D regions are made of silicon (Si) and the first and second PFET S/D regions are made of first layer of silicon-germanium (SiGe) with a first concentration of germanium (Ge) and a second layer of SiGe with a second concentration of Ge and a surface, the second layer of SiGe being directly on the first layer of SiGe, the second layer of SiGe being implanted with Gallium (Ga) with an implantation dose between $1\times10^{15}$ ions/cm$^2$ to $5\times10^{15}$ ions/cm$^2$; and one or more contact trenches, each of the contact trenches having side walls and filled with a metal providing a metallic electrical connection to one of the first and the second source/drain (S/D) regions of PFETs and NFETs, respectively, through a barrier metallic liner, wherein the surface of each of the second layers of SiGe is aligned with and in direct electrical contact with one of the contact trenches, the surface having a convex shape and the second concentration of Ge being higher than the first concentration of Ge, the alignment being so that the metallic electrical connection, the barrier metallic liner, and the surface are within the respective NFET S/D and PFET regions and do not extend past the sidewalls toward the gate stack.

* * * * *